(12) United States Patent
Kariya et al.

(10) Patent No.: US 8,225,503 B2
(45) Date of Patent: Jul. 24, 2012

(54) METHOD FOR MANUFACTURING BOARD WITH BUILT-IN ELECTRONIC ELEMENTS

(75) Inventors: Takashi Kariya, Gifu (JP); Toshiki Furutani, Gifu (JP)

(73) Assignee: Ibiden Co., Ltd., Ogaki-shi (JP)

(*) Notice: Subject to any disclaimer, the term of this patent is extended or adjusted under 35 U.S.C. 154(b) by 710 days.

(21) Appl. No.: 12/163,252

(22) Filed: Jun. 27, 2008

(65) Prior Publication Data

US 2009/0199399 A1 Aug. 13, 2009

Related U.S. Application Data

(60) Provisional application No. 61/027,660, filed on Feb. 11, 2008.

(51) Int. Cl.
*H05K 3/10* (2006.01)
(52) U.S. Cl. ........... 29/852; 29/833; 29/840; 29/846; 174/260; 438/108; 438/112
(58) Field of Classification Search ............ 156/150, 156/233, 247; 174/257, 260; 205/78, 125; 216/18; 257/676, 700, 758, 773, 774; 427/97.2; 430/314, 315; 438/108, 112, 123, 614, 667; 29/830–833, 840, 846, 848, 852
See application file for complete search history.

(56) References Cited

U.S. PATENT DOCUMENTS

| | | | | |
|---|---|---|---|---|
| 4,606,787 A * | 8/1986 | Pelligrino | | 29/848 |
| 6,784,530 B2 * | 8/2004 | Sugaya et al. | | 257/700 |
| 6,933,594 B2 * | 8/2005 | McLellan et al. | | 257/676 |
| 6,958,544 B2 * | 10/2005 | Sunohara | | 257/758 |
| 6,969,905 B2 * | 11/2005 | Paulus | | 257/676 |
| 2002/0117743 A1 | 8/2002 | Nakatani et al. | | |
| 2007/0056766 A1 | 3/2007 | Sunohara | | |

FOREIGN PATENT DOCUMENTS

| | | |
|---|---|---|
| JP | 2005-217225 | 8/2005 |
| JP | 2006-165175 | 6/2006 |
| JP | 2007-88009 | 4/2007 |
| JP | 2007-123797 | 5/2007 |
| JP | 2008-503076 | 1/2008 |
| TW | 511405 | 11/2002 |
| TW | 200721934 | 6/2007 |
| WO | 2005/125298 A2 | 12/2005 |
| WO | 2005/125298 A3 | 12/2005 |
| WO | WO 2005/125298 A3 | 12/2005 |

* cited by examiner

*Primary Examiner* — Donghai D. Nguyen
(74) *Attorney, Agent, or Firm* — Oblon, Spivak, McClelland, Maier & Neustadt, L.L.P.

(57) ABSTRACT

A method for manufacturing a board with a built-in electronic element, includes providing a support substrate including a support base and a metal foil, forming a protective film made of a metal material on the metal foil of the support substrate, forming a conductive pattern made of a metal material on the protective film by an additive method, placing an electronic element on the support substrate with the conductive pattern such that a surface of the electronic element where a circuit is formed faces the conductive pattern, covering the electronic element with an insulative resin, etching away the metal foil using a first etching solution such that the protective film is not dissolved by the first etching solution or that the protective film has an etching speed which is slower than an etching speed of the metal foil, and electrically connecting terminals of the electronic element and a part of the conductive pattern.

10 Claims, 24 Drawing Sheets

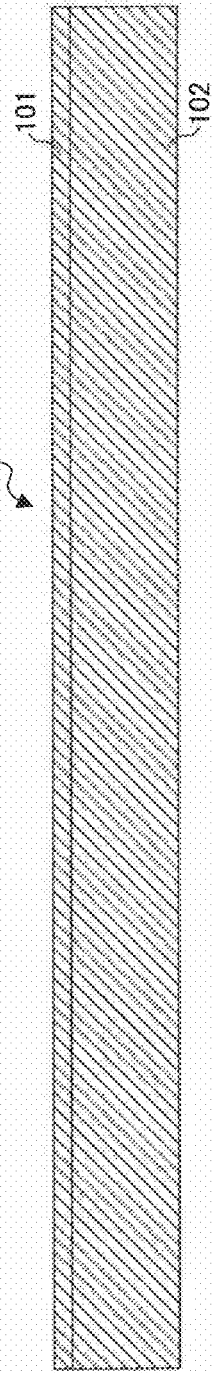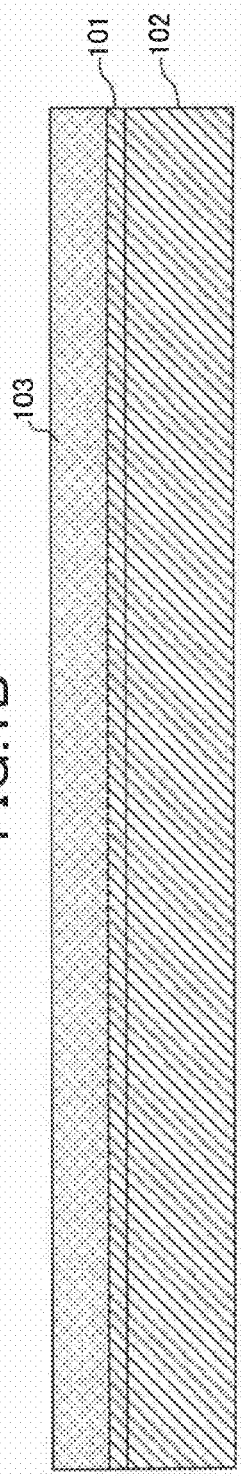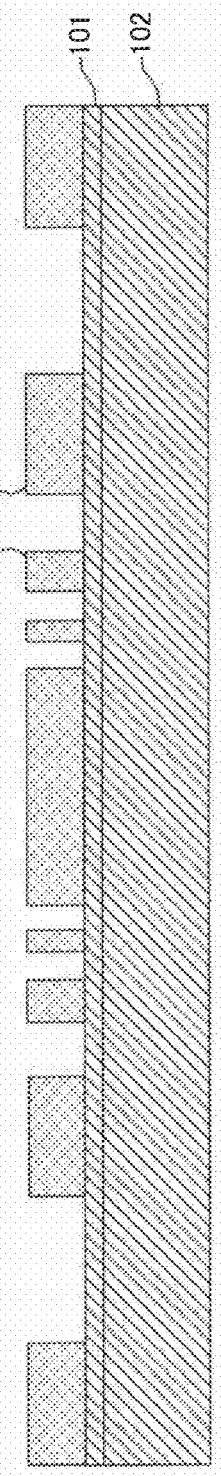

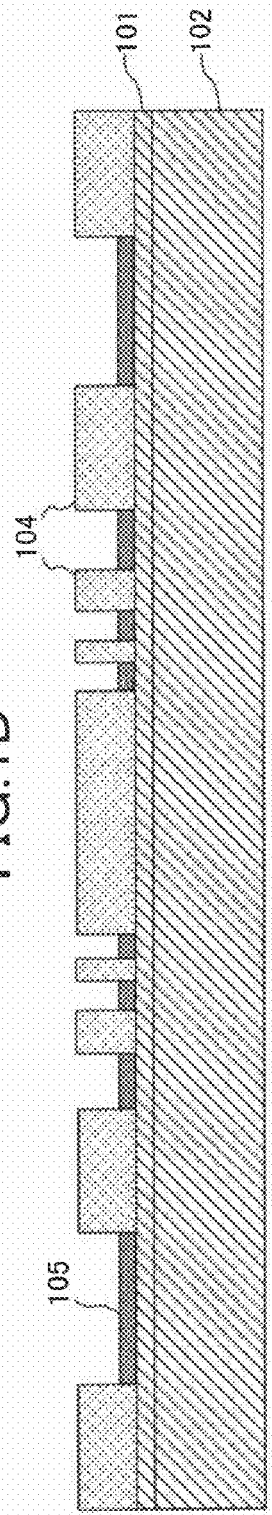
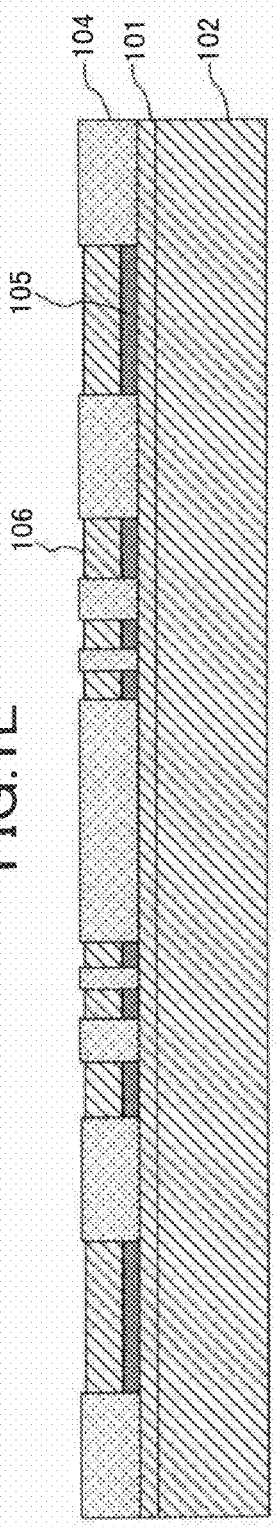
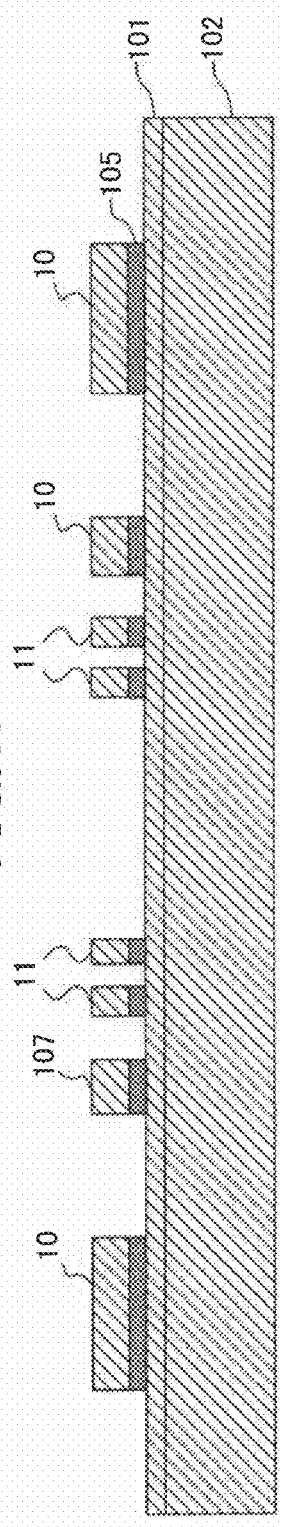

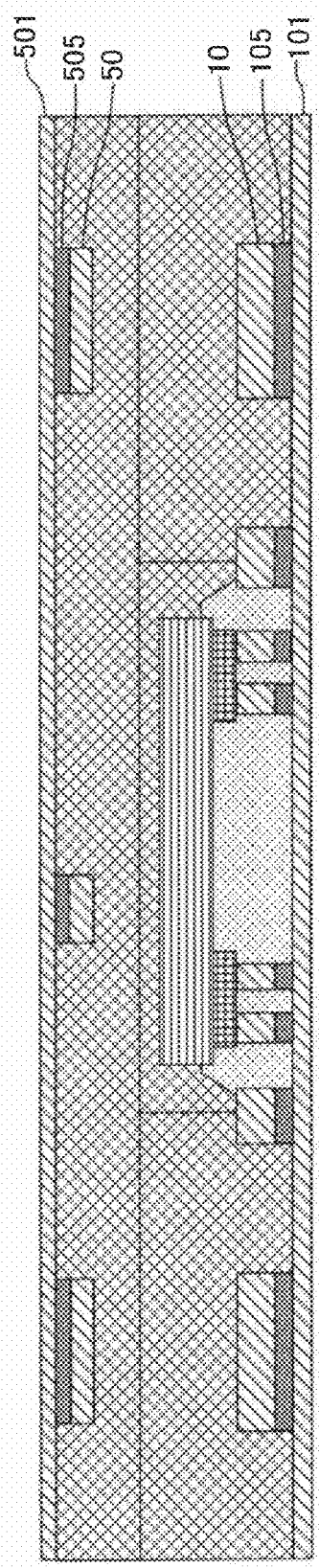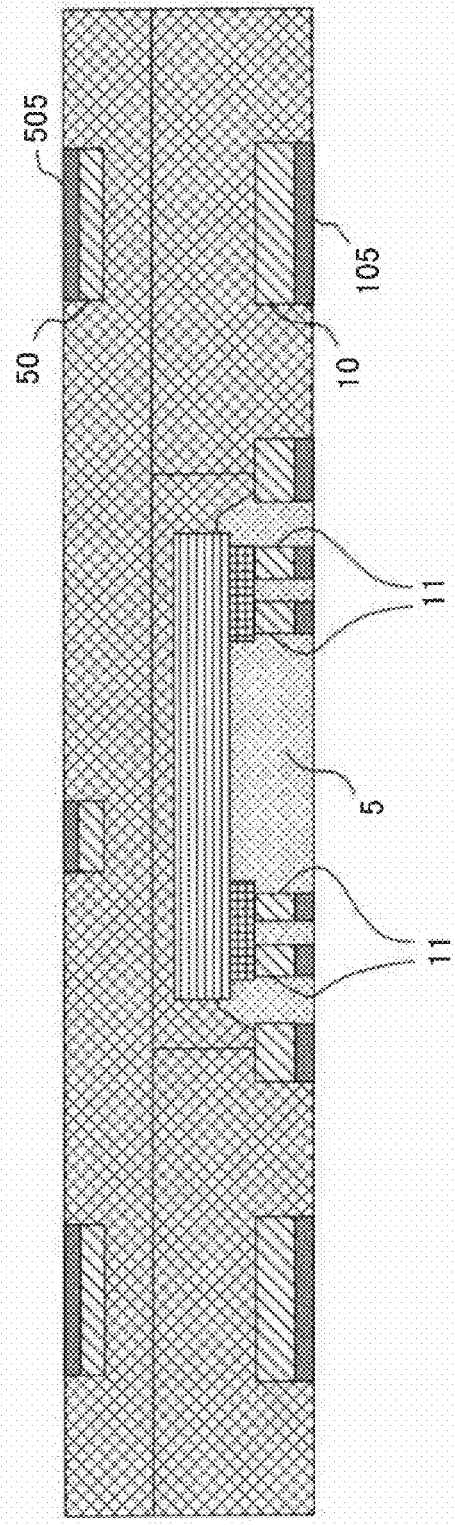
FIG.4A
FIG.4B

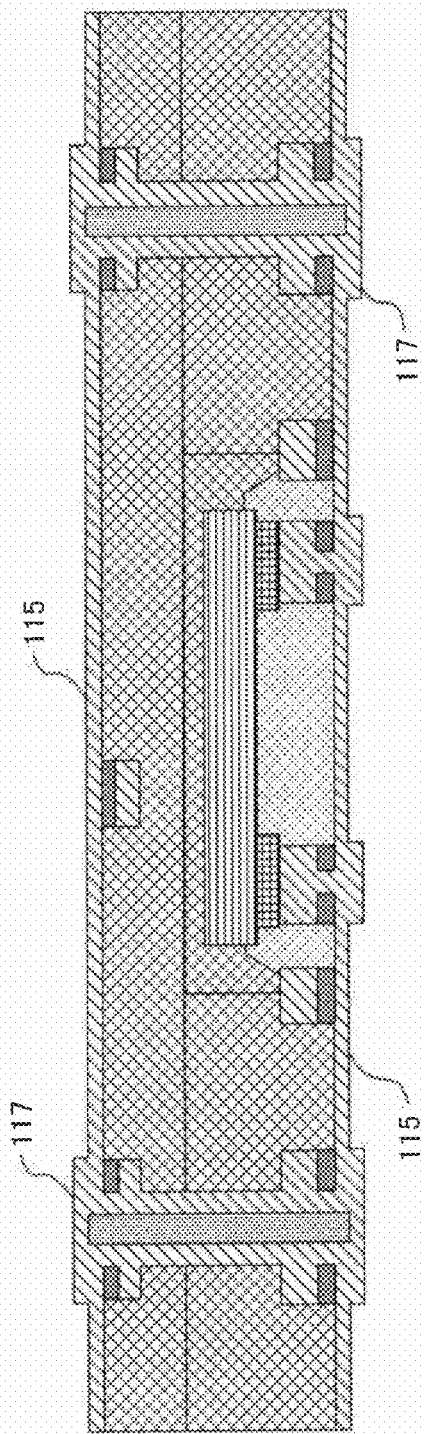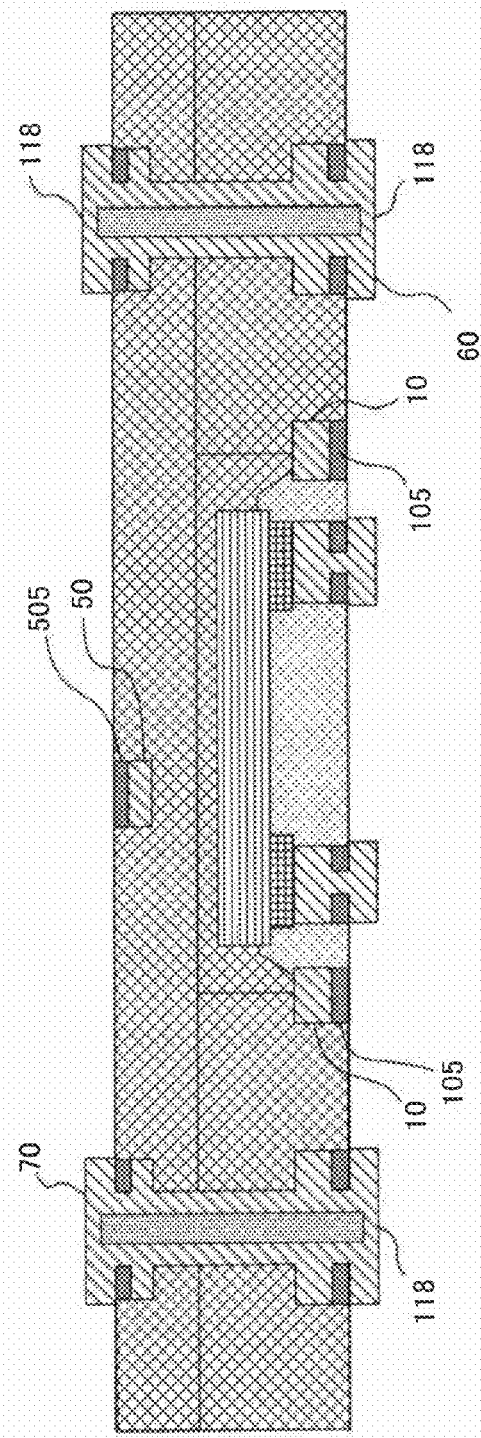

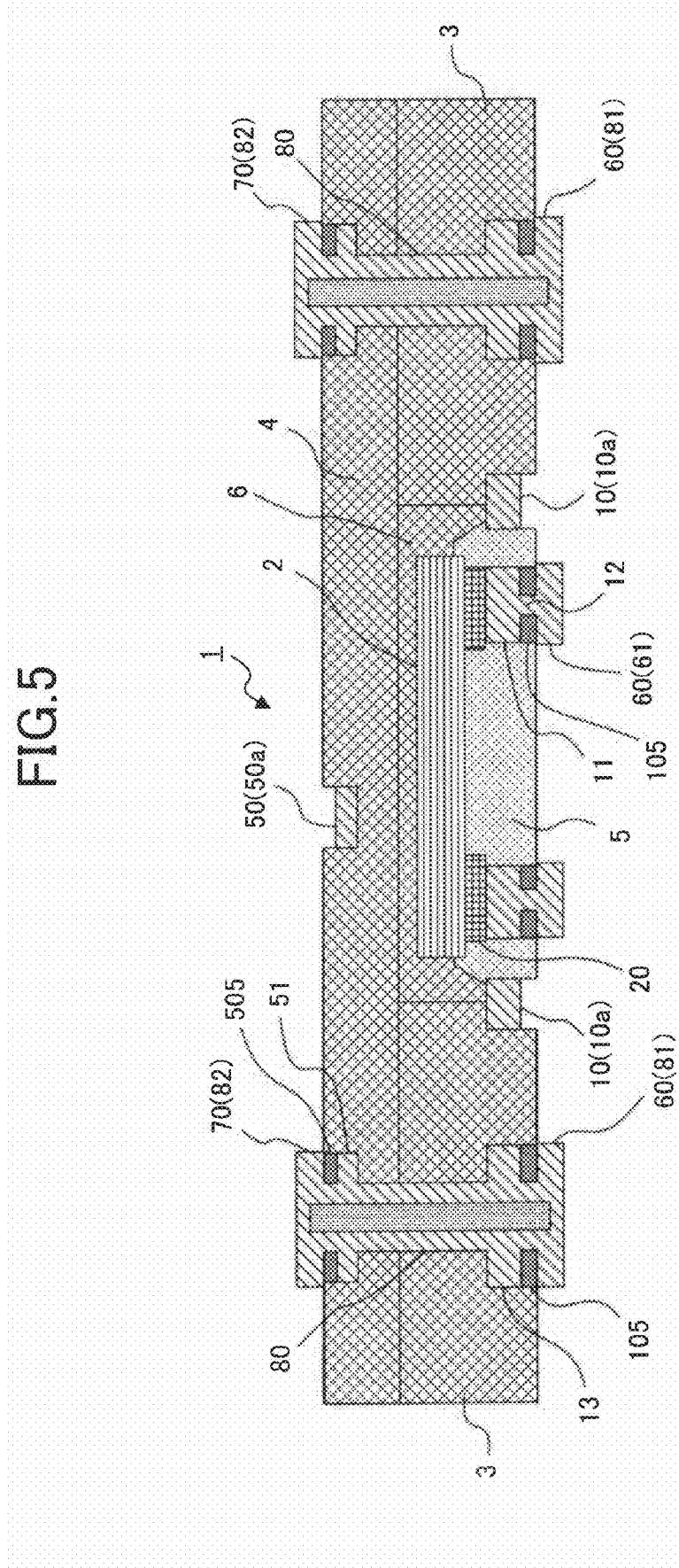

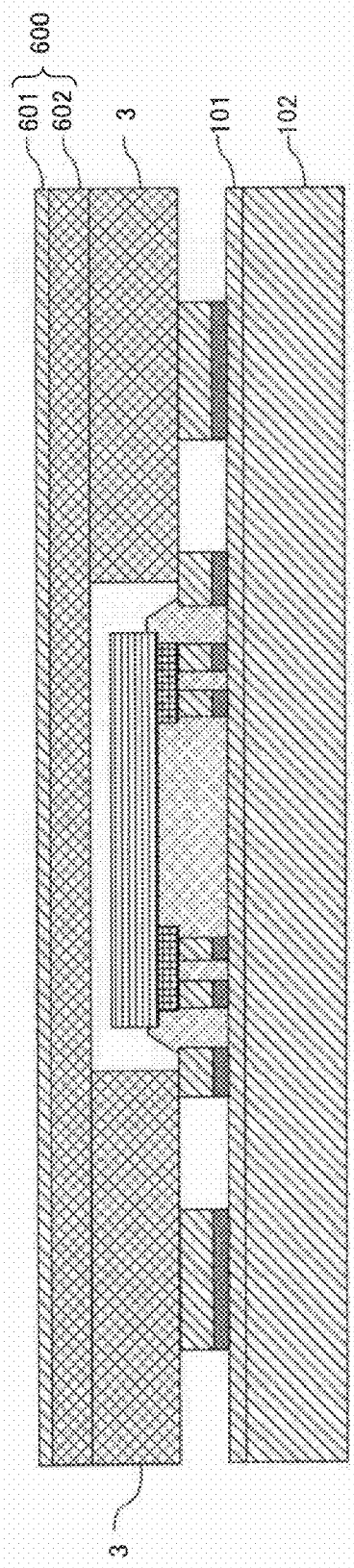

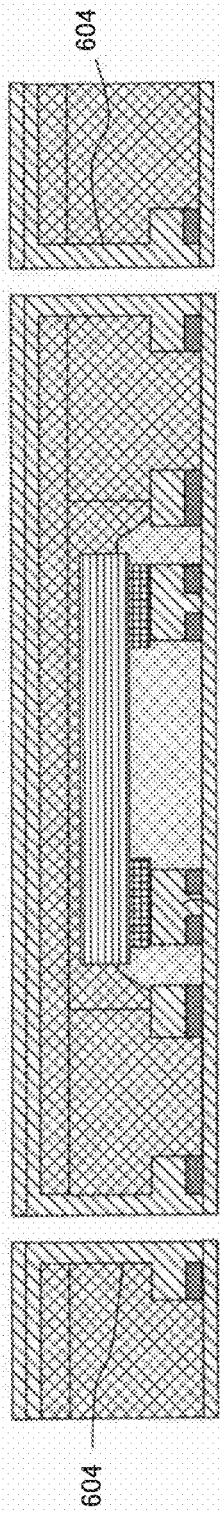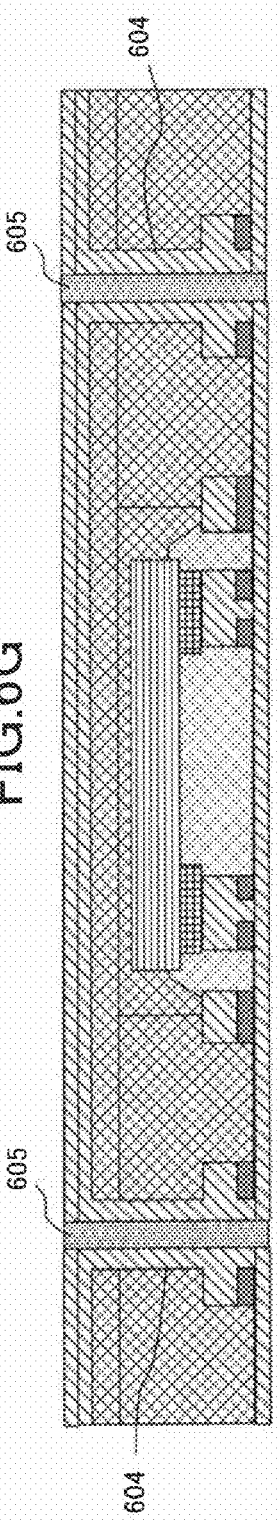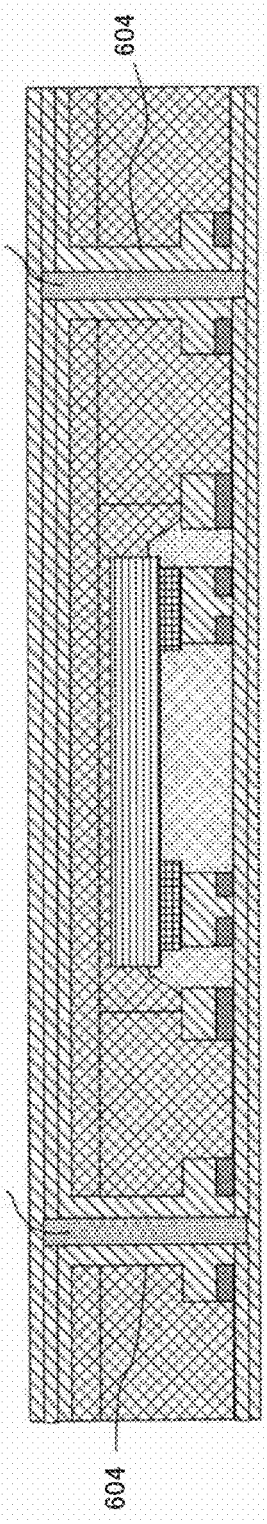

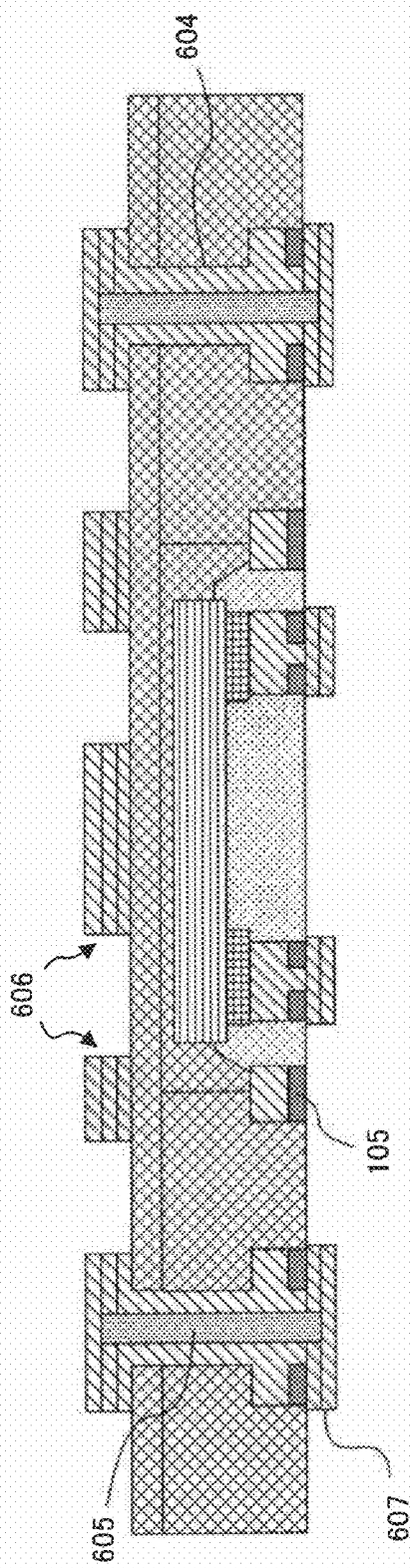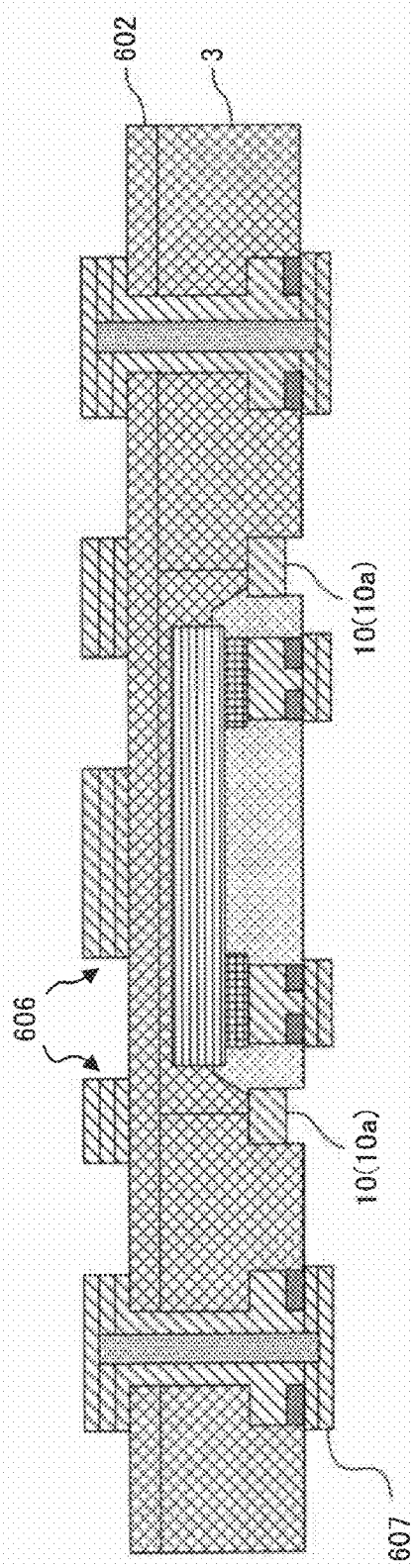

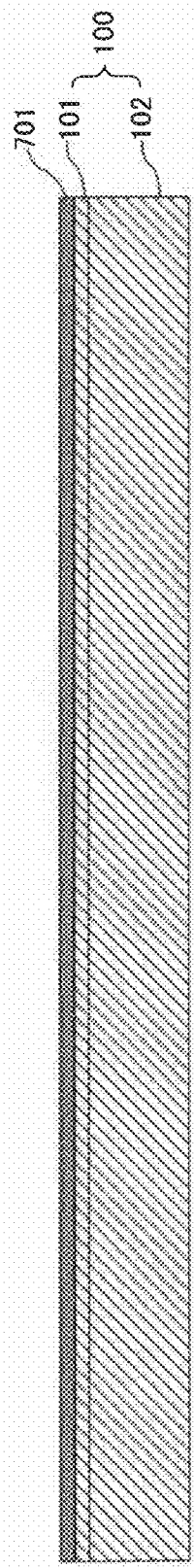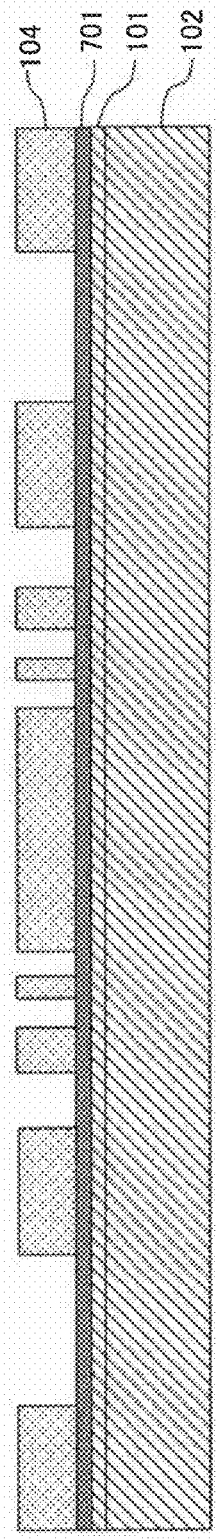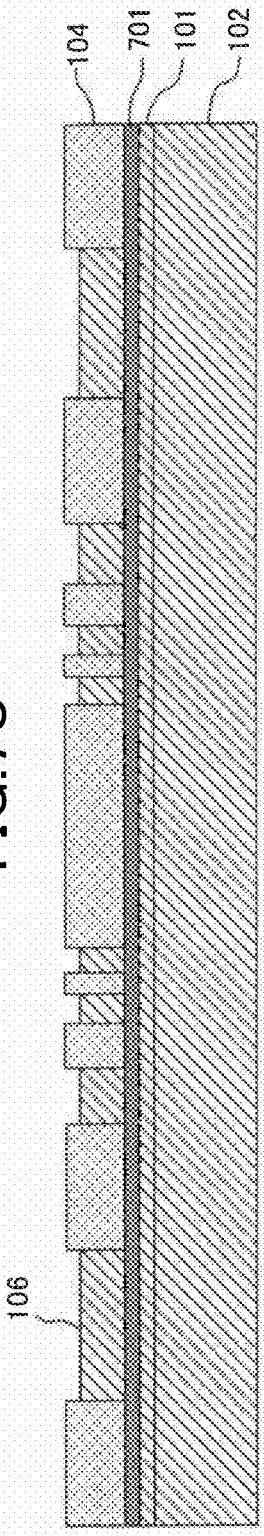

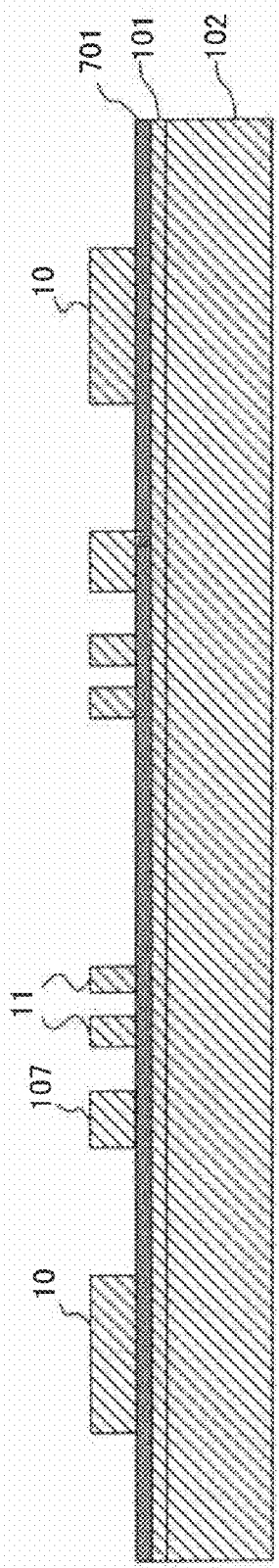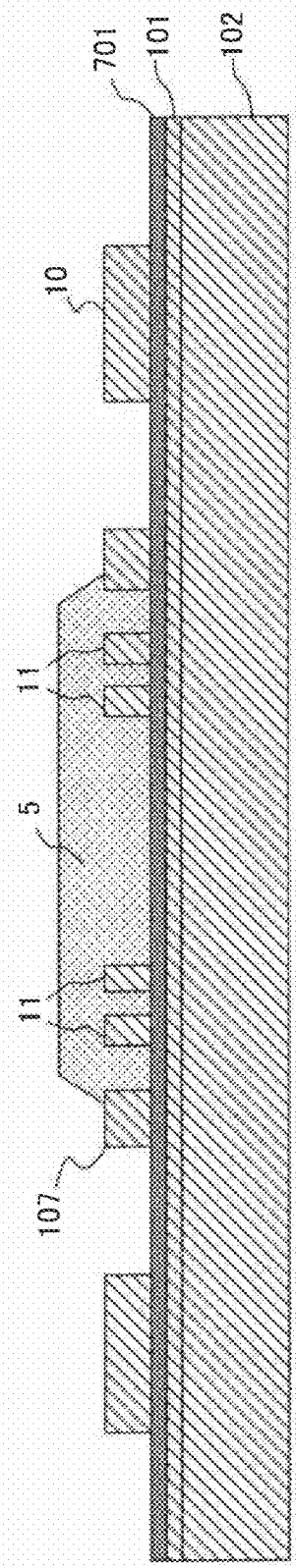

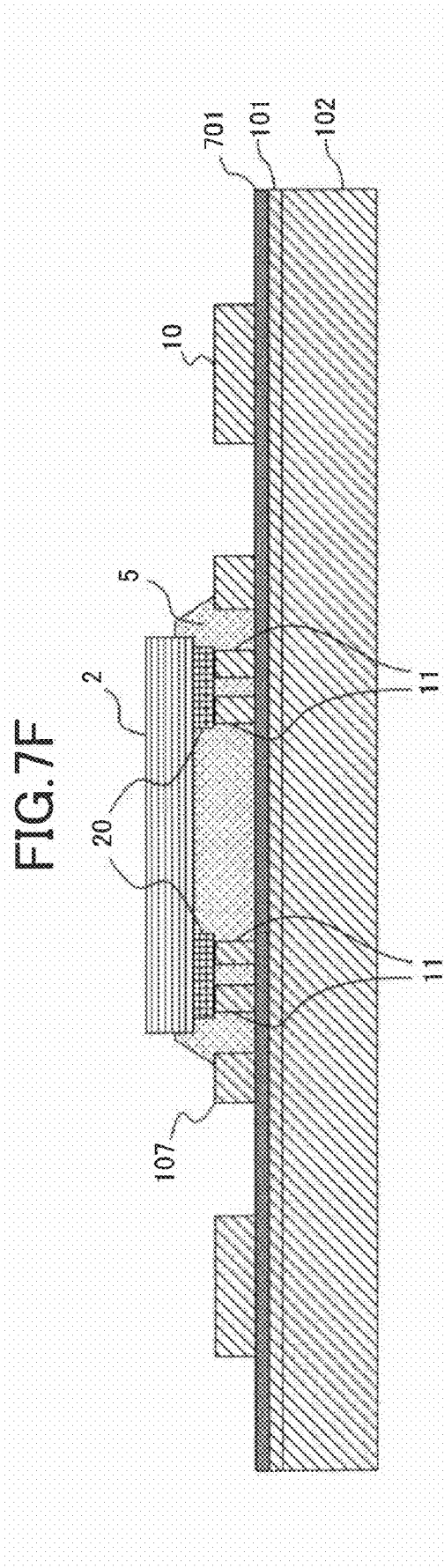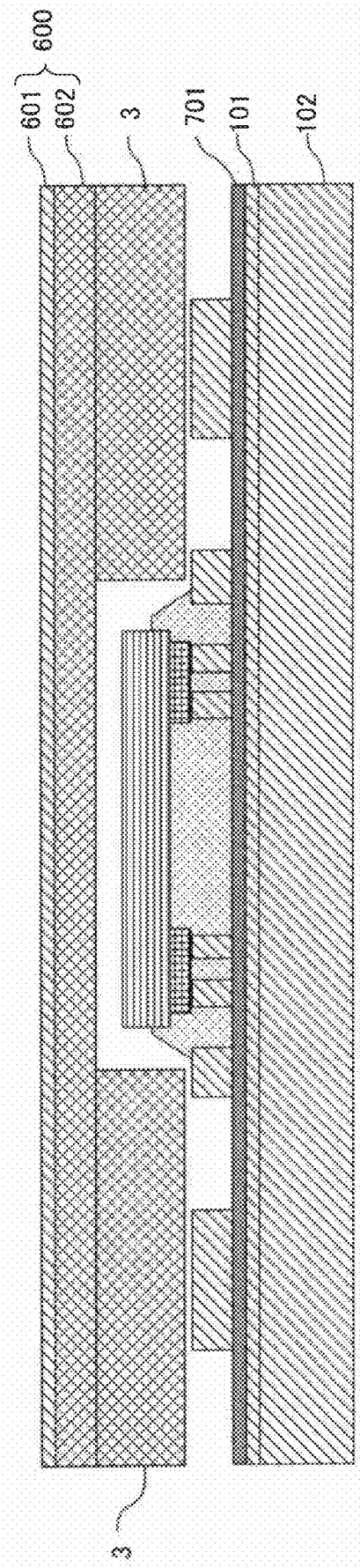

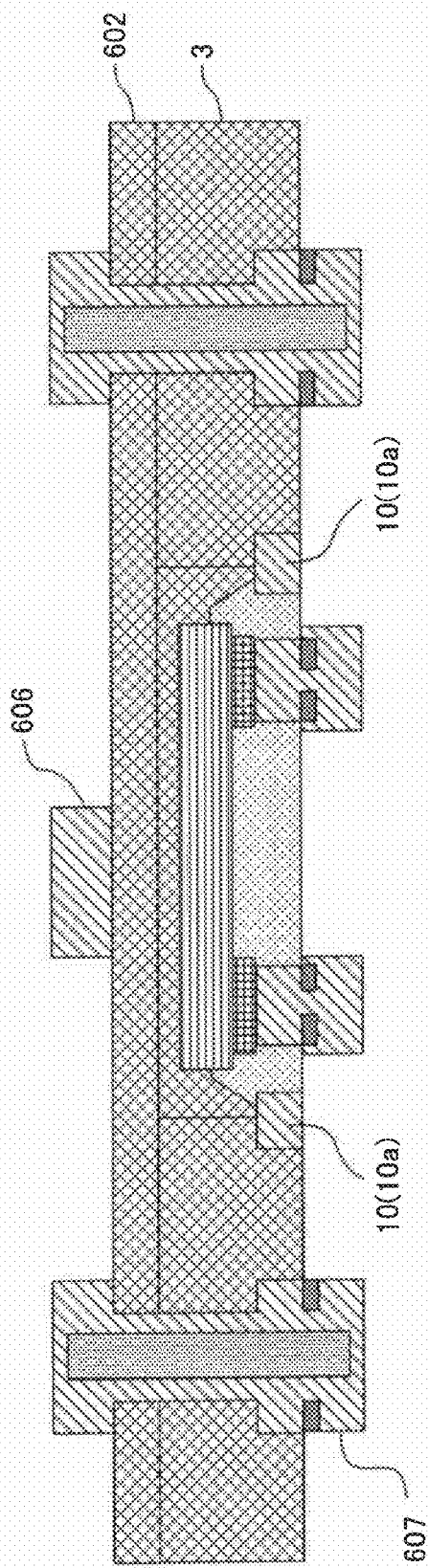

METHOD FOR MANUFACTURING BOARD WITH BUILT-IN ELECTRONIC ELEMENTS

CROSS-REFERENCE TO RELATED APPLICATIONS

The present application claims the benefits of priority to U.S. Applications No. 61/027,660, filed Feb. 11, 2008. The contents of that application are incorporated herein by reference in its entirety.

BACKGROUND OF THE INVENTION

1. Field of the Invention

The present invention relates to a method for manufacturing a board with built-in electronic elements such as semiconductor elements.

2. Description of the Related Art

In recent years, electronic devices have become more compact and highly functional. Accordingly, demand has increased for a wiring board mounted in an electronic device to be more compact and highly integrated.

In response, various technologies are suggested, such as design to make compact and highly integrated wiring boards by accommodating (building in) electronic elements in a wiring board (for example, technology disclosed in International Publication Number WO 2005/125298.)

The method for manufacturing an electronics module disclosed in International Publication Number WO 2005/125298 is briefly described as follows:

(1) A base material is prepared in which a conductive layer such as copper is disposed on a surface of a support board such as aluminum. On the surface of the board (on the conductive-layer side), multiple concave portions are formed using a laser or the like. Those concave portions are formed so as to correspond to each terminal of an electronic element to be mounted.

(2) By aligning each terminal with its corresponding concave portion, the electronic element is placed on the base material and is secured through an adhesive layer.

(3) On the base material with the placed electronic element, an insulation layer and a conductive layer are laminated and pressed.

(4) Through-holes are formed in the board after pressing, then the conductive layers on both main surfaces of the board are made electrically continuous by copper plating.

(5) Using a subtractive method, a conductive pattern is formed.

In the above manufacturing method, a conductive pattern to be electrically connected to the electronic element is formed by a subtractive method. Here, a subtractive method is a method by which an etching resist is formed on a metal foil or a conductive layer and the portions where the etching resist is not formed are etched away by using an etching solution so that a conductive pattern is formed (see Textbook: Technologies for Printed Wiring Board, published by Nikkan Kogyo Shimbun, Ltd.)

The contents of these publications are incorporated herein by reference in their entirety.

SUMMARY OF THE INVENTION

According to one aspect of the present invention, a method for manufacturing a board with a built-in electronic element includes providing a support substrate including a support base and a metal foil, forming a protective film made of a metal material on the metal foil of the support substrate, forming a conductive pattern made of a metal material on the protective film by an additive method, placing an electronic element on the support substrate with the conductive pattern such that a surface of the electronic element where a circuit is formed faces the conductive pattern, covering the electronic element with an insulative resin, etching away the metal foil using a first etching solution such that the protective film is not dissolved by the first etching solution or that the protective film has an etching speed which is slower than an etching speed of the metal foil, and electrically connecting terminals of the electronic element and a part of the conductive pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. (1A)-(1F) are cross-sectional views showing the steps for forming a conductive pattern which is to be connected to an electronic element.

Figure 2A:
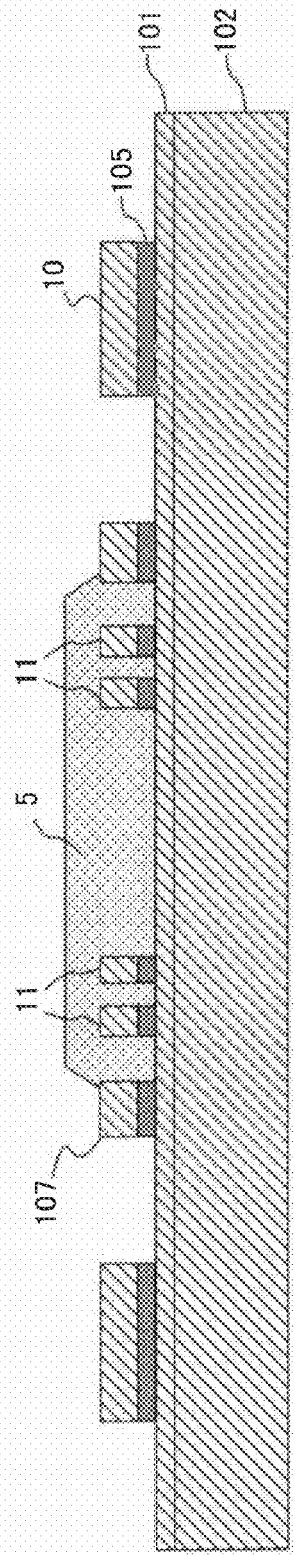
Figure 2B:
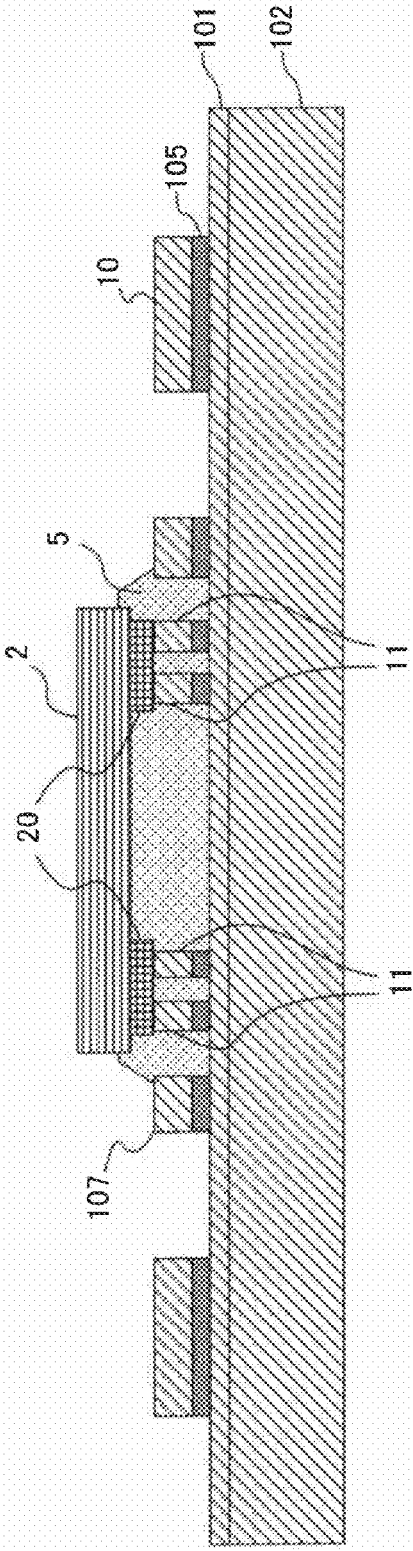
Figure 2C:
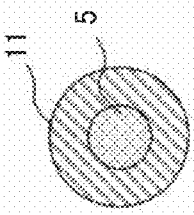
Figure 3A:
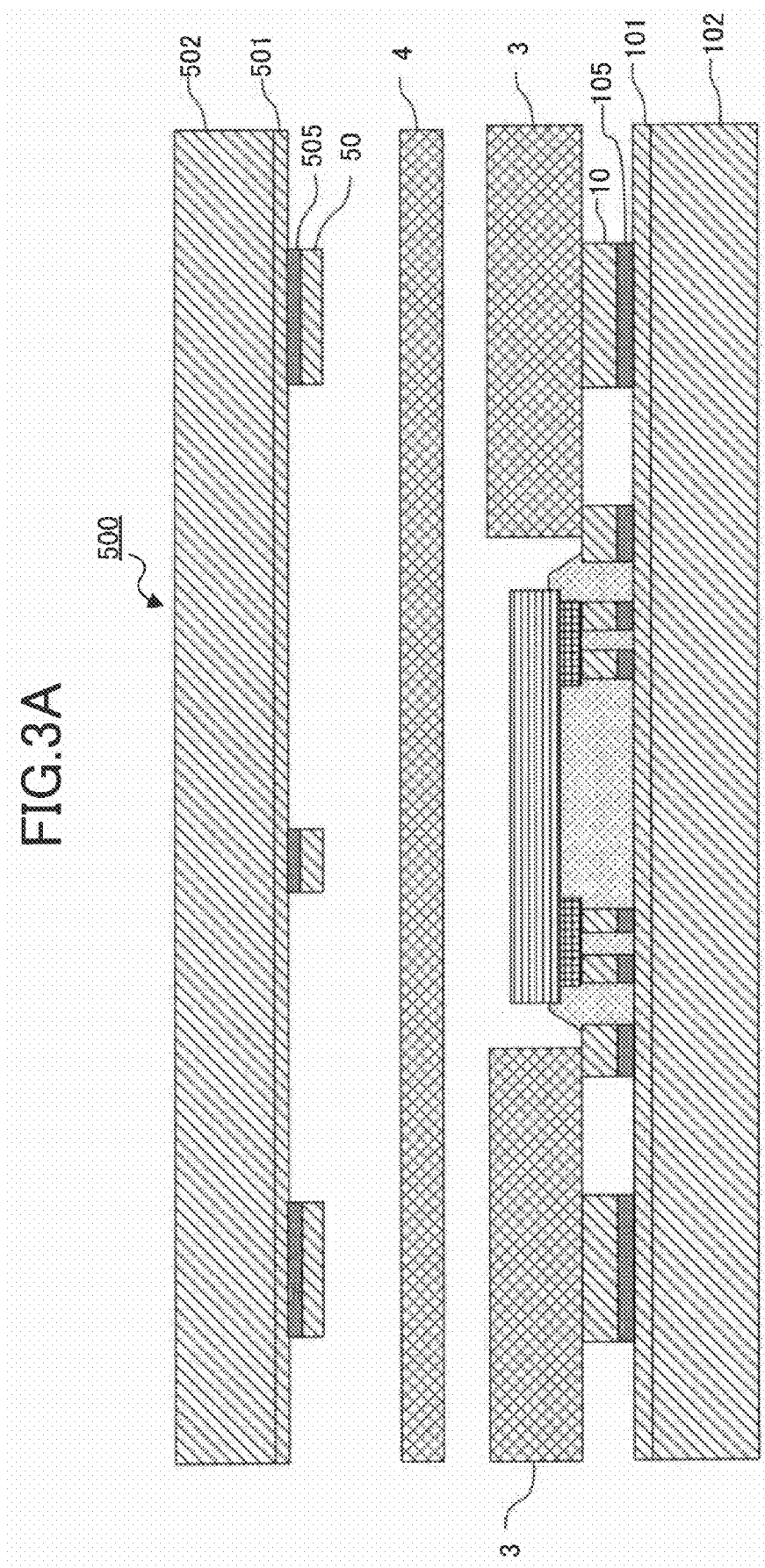
Figure 3B:
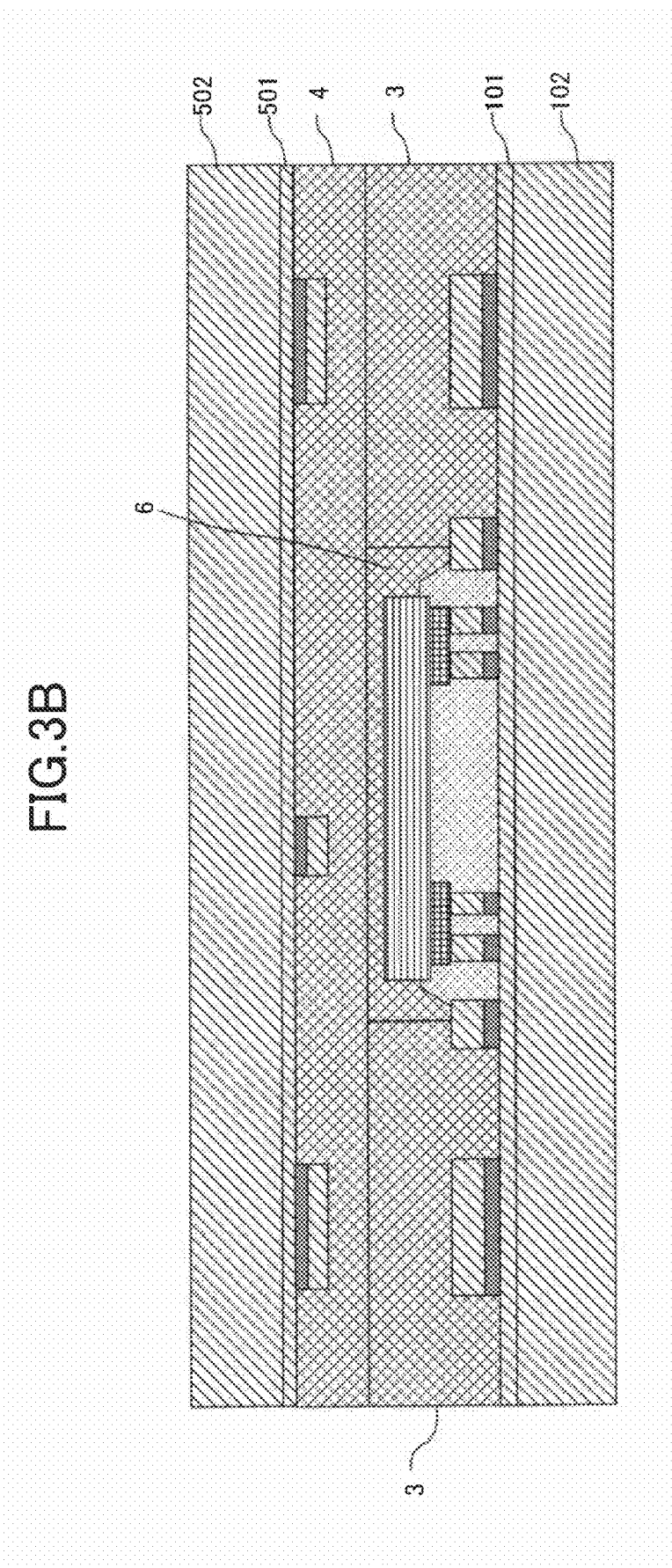
Figure 4C:
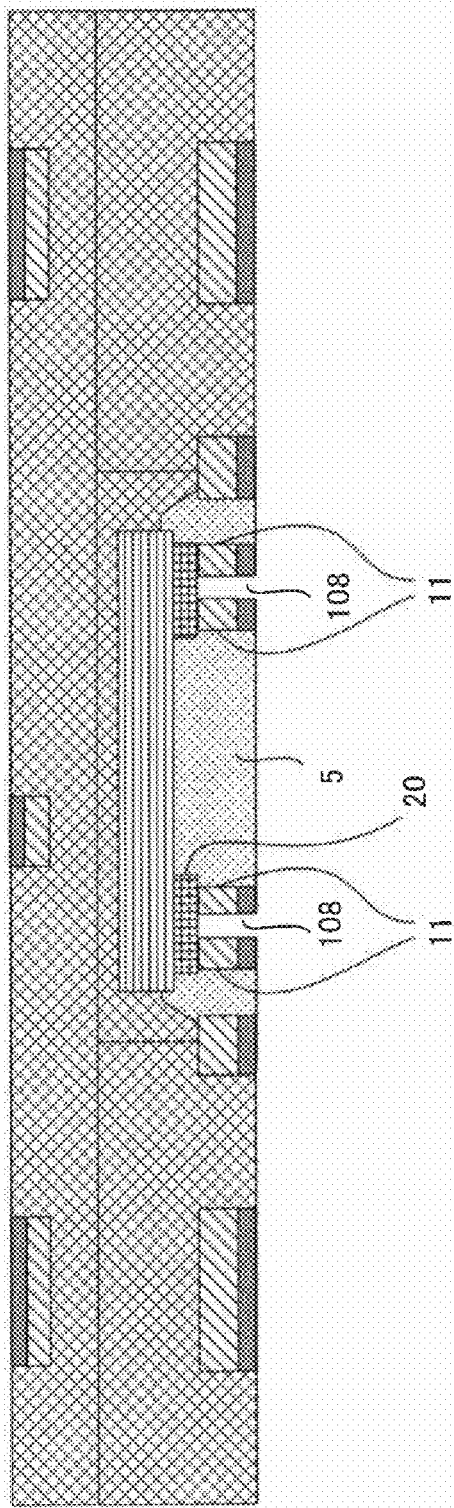
Figure 4D:
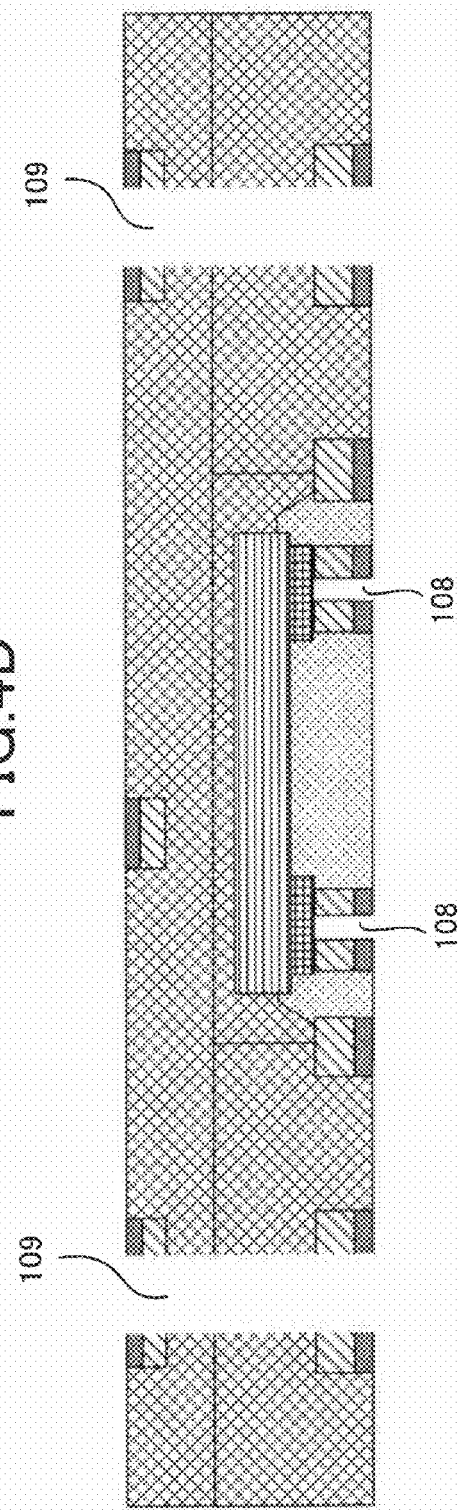
Figure 4E:
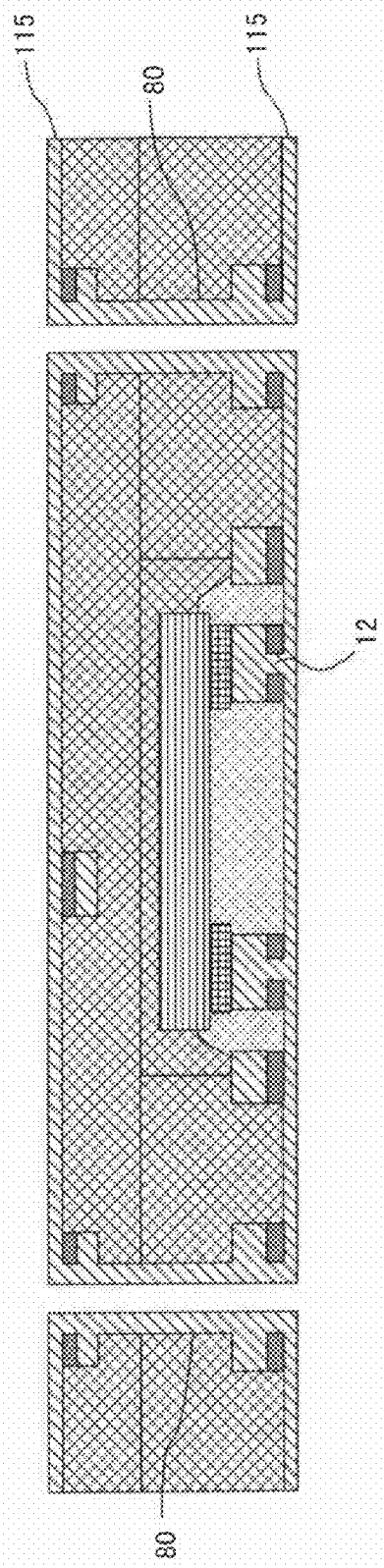
Figure 4F:
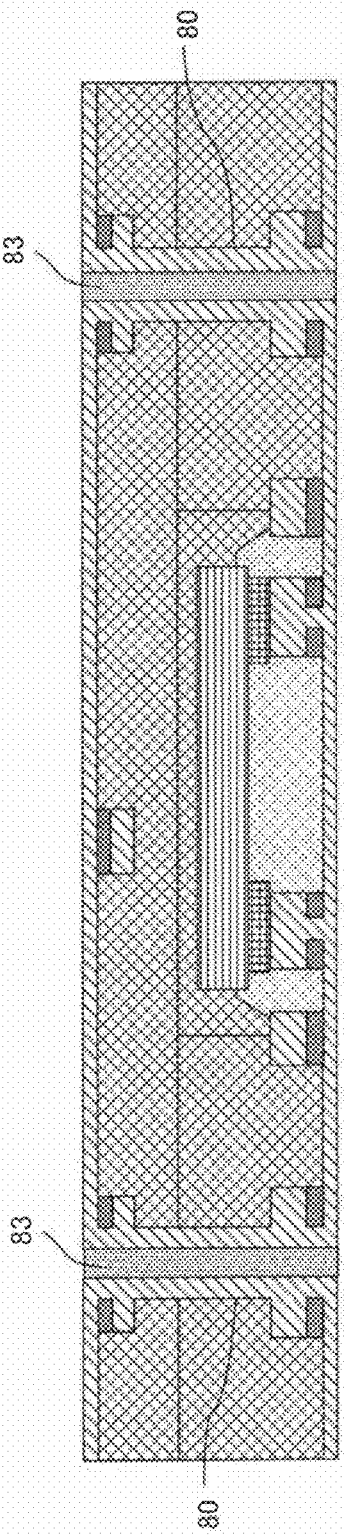
Figure 4G:
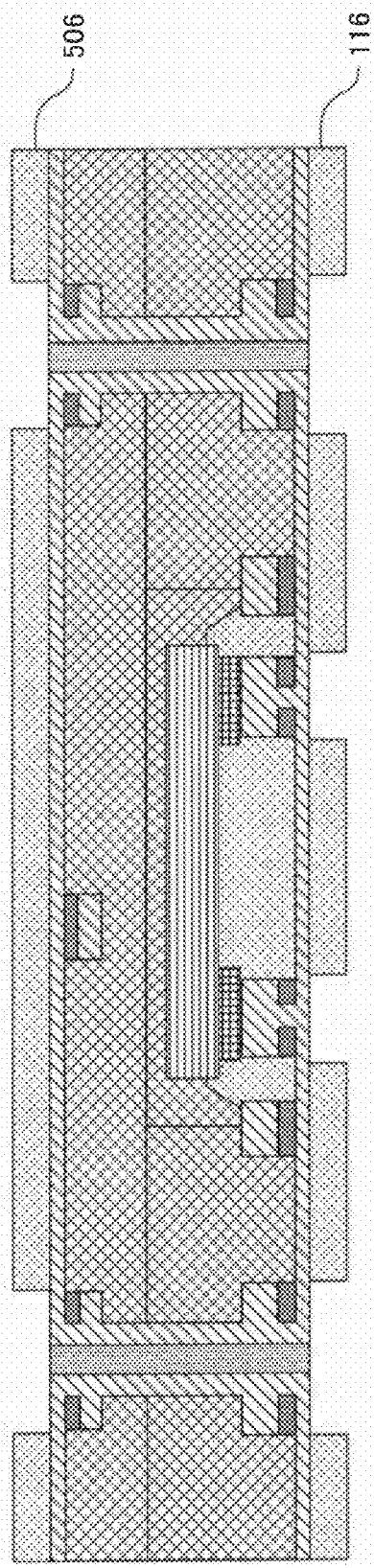
Figure 4H:
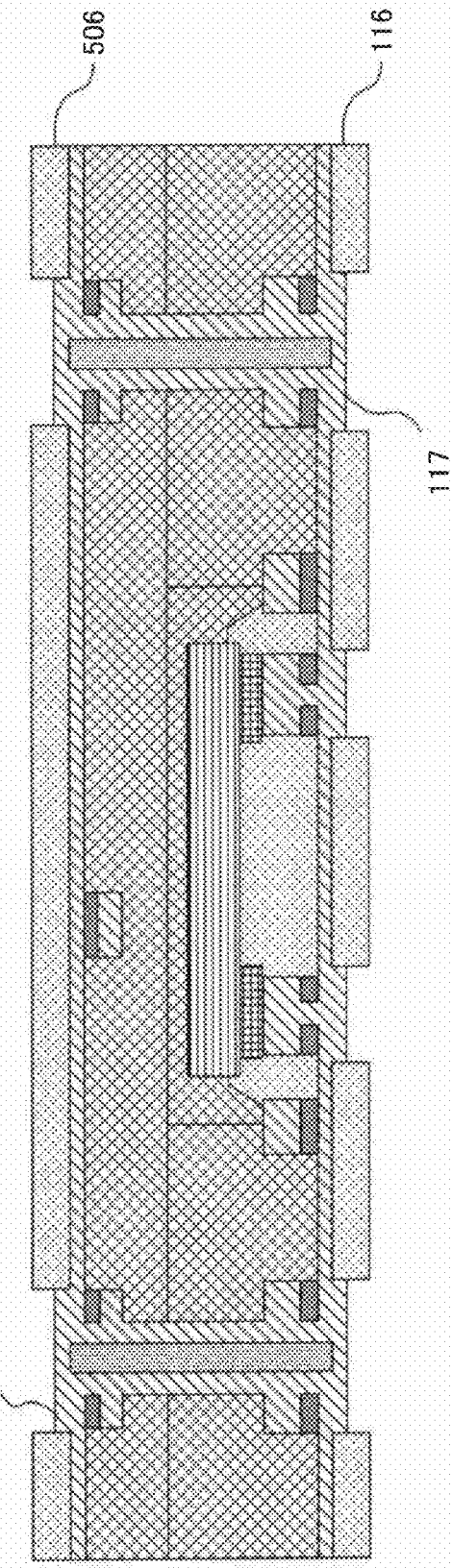
Figure 6C:
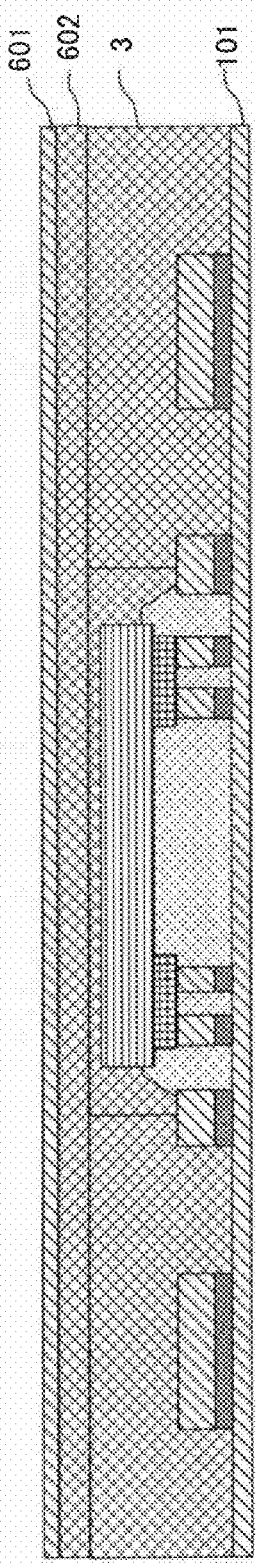
Figure 6D:
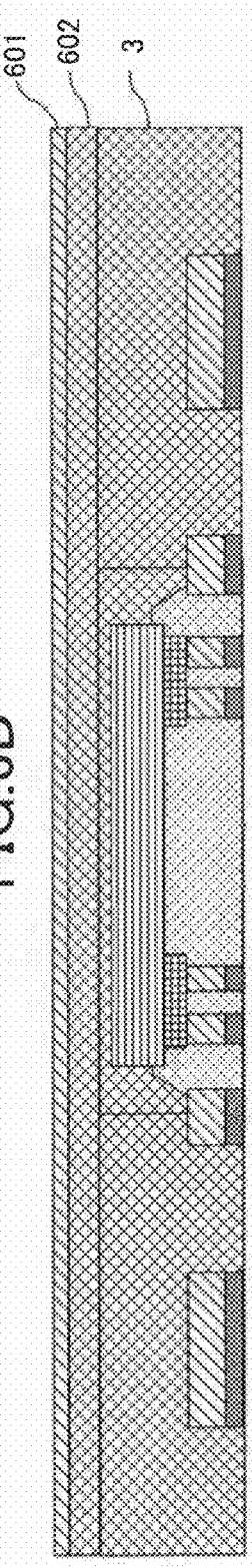
Figure 6E:
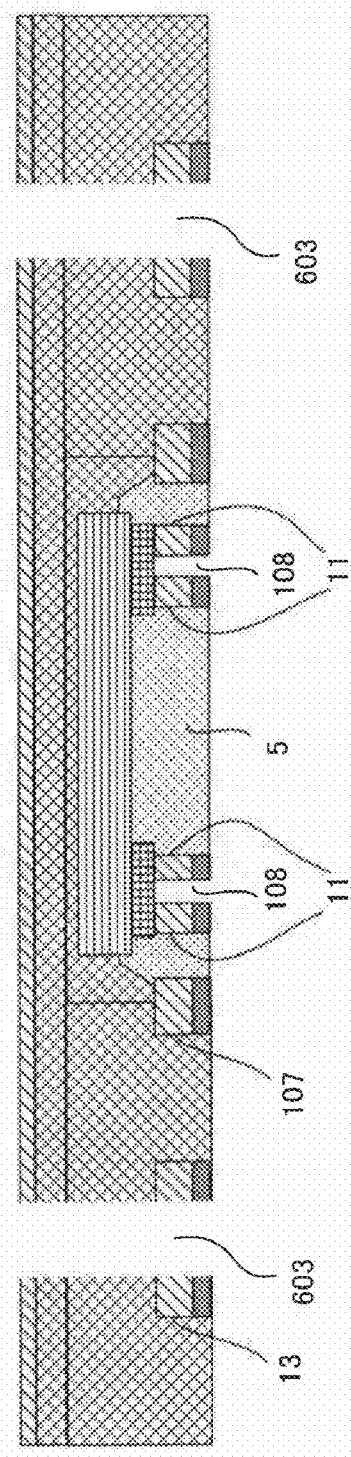
Figure 7H:
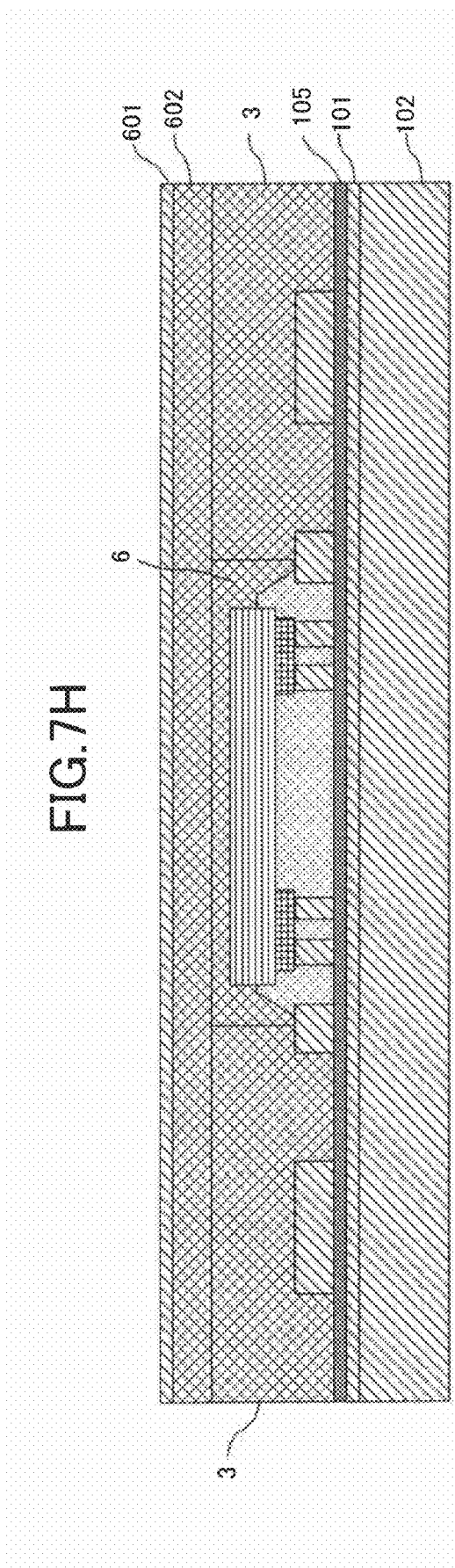
Figure 7I:
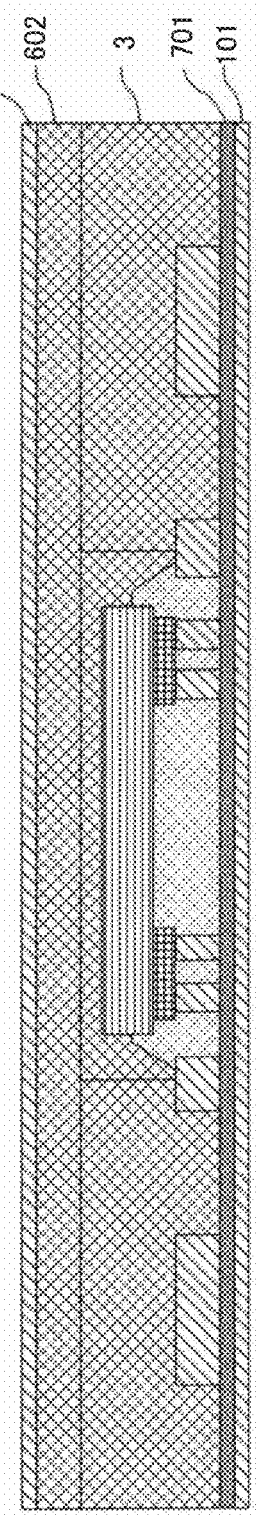
Figure 7J:
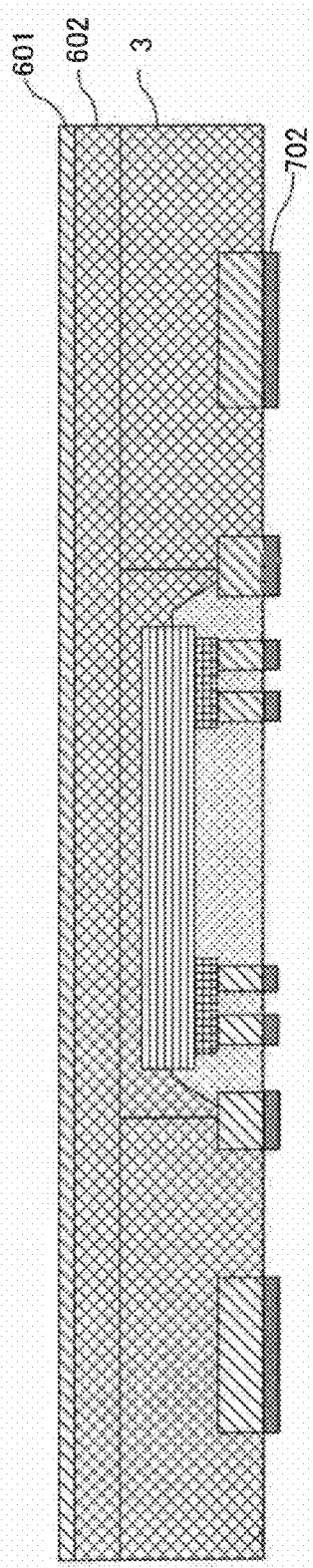
Figure 7K:
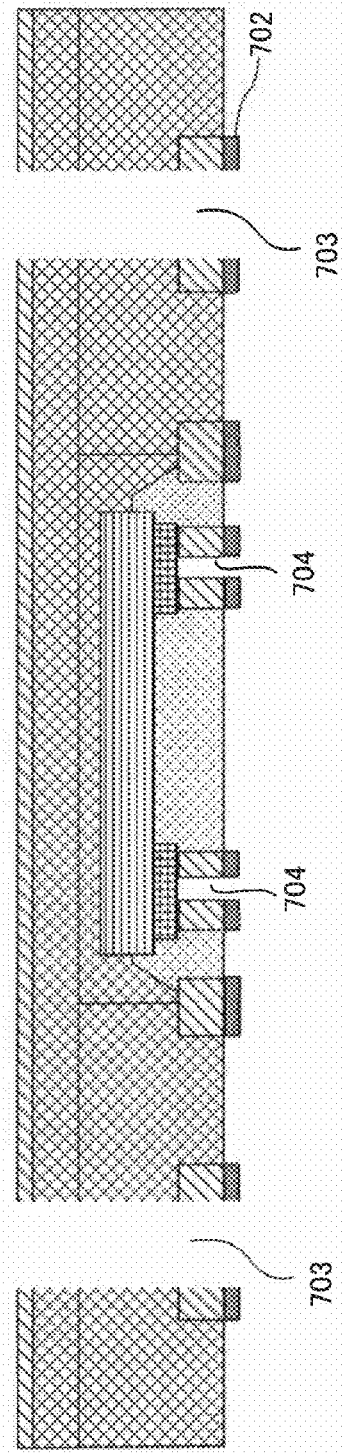
Figure 7L:
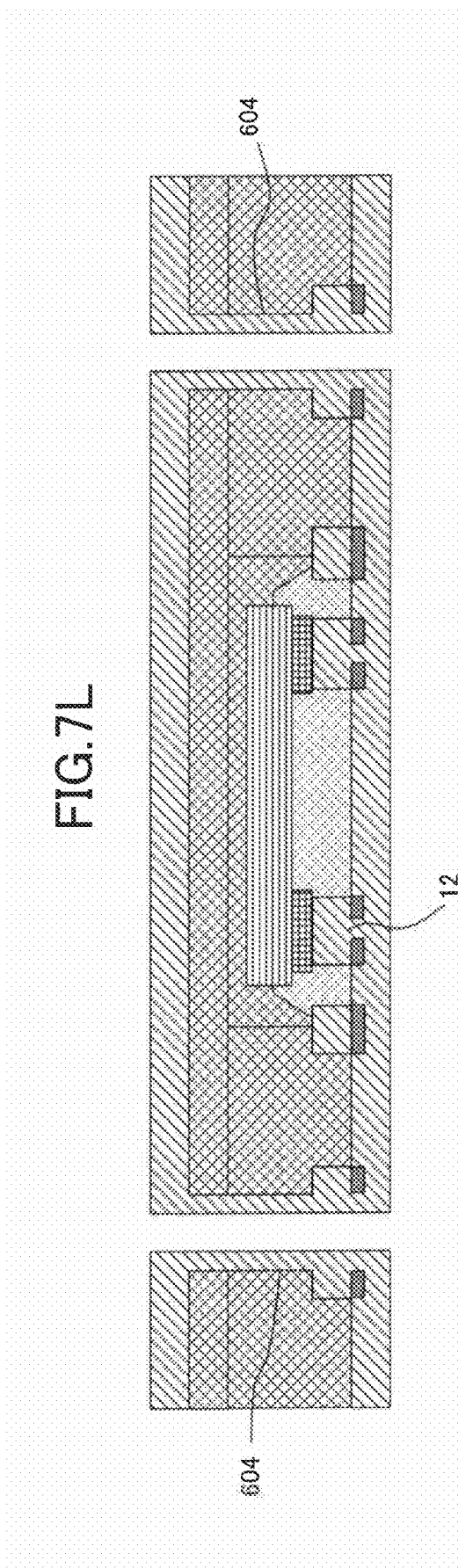
Figure 7M:
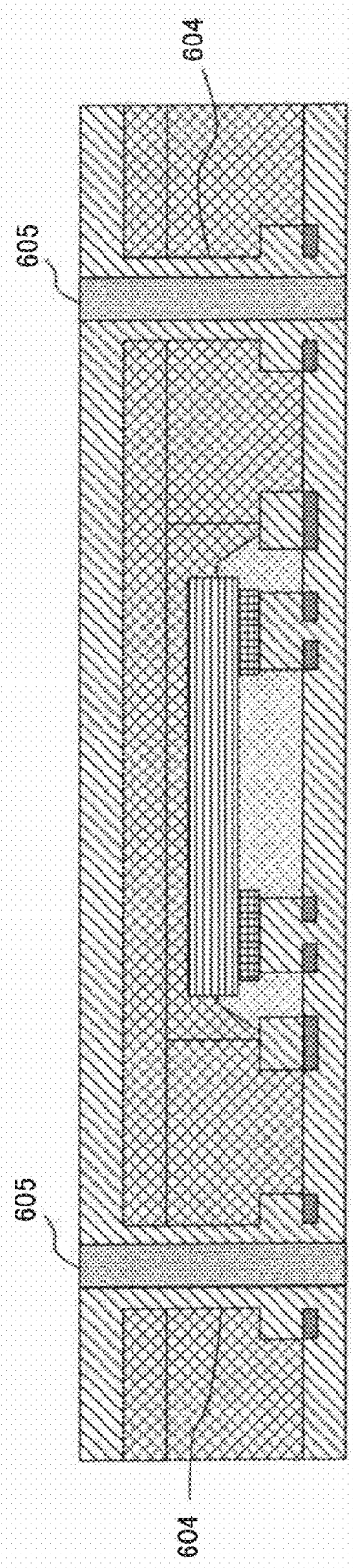
Figure 7N:
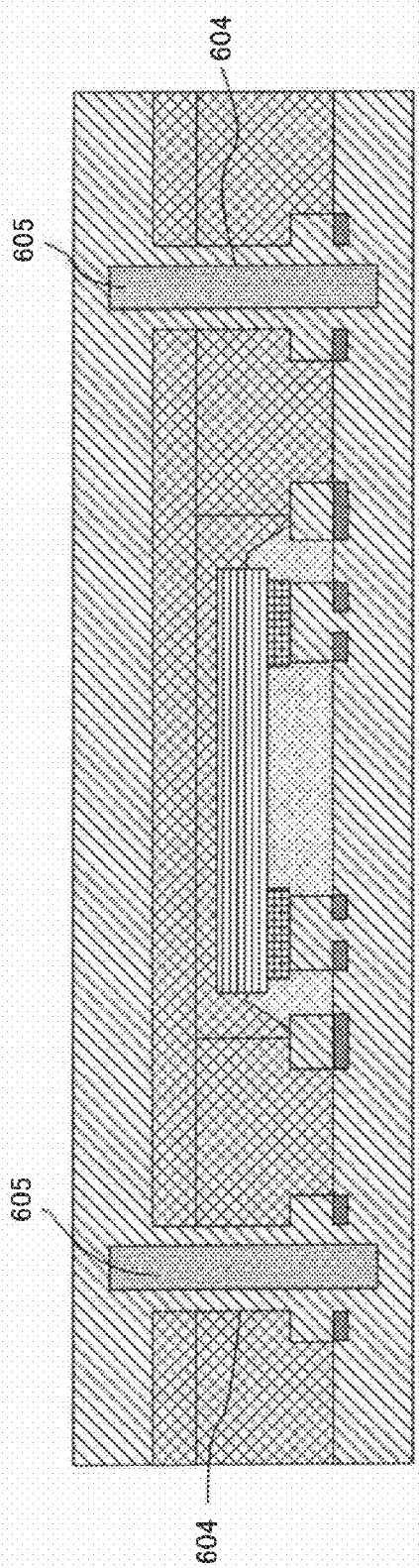
Figure 7O:
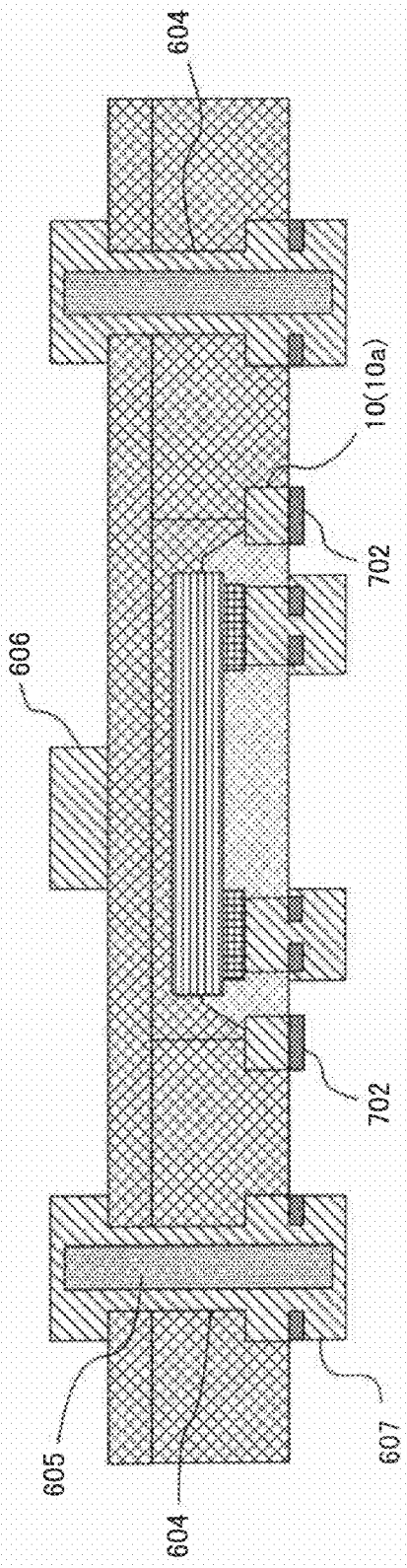

FIGS. (2A) and (2B) are cross-sectional views showing the steps for mounting an electronic element.

FIG. (2C) is a plan view of a via land in the first inner layer seen from the electronic element side.

FIGS. (3A) and (3B) are cross-sectional views showing the lamination steps.

FIGS. (4A)-(4J) are cross-sectional views showing the latter-part steps.

FIG. (5) is a cross-sectional view showing the board with a built-in electronic element according to Embodiment (1) of the present invention.

FIGS. (6A)-(6J) are cross-sectional views showing the steps for manufacturing a board with a built-in electronic element according to Embodiment (2) of the present invention.

FIGS. (7A)-(7P) are cross-sectional views showing the steps for manufacturing a board with a built-in electronic element according to Embodiment (3) of the present invention.

FIG. (8) is a cross-sectional view showing a built-up multilayer printed wiring board using the board with a built-up electronic element according to Embodiment (3).

DETAILED DESCRIPTION OF THE PREFERRED EMBODIMENTS

The embodiments will now be described with reference to the accompanying drawings, wherein like reference numerals designate corresponding or identical elements throughout the various drawings.

In the following, a method for manufacturing a board with a built-in electronic element is described according to the embodiments of the present invention with reference to the drawings.

Embodiment (1)

FIG. (5) is a schematic cross-sectional view of board (1) with a built-in electronic element manufactured according to Embodiment (1). Board (1) with a built-in electronic element is used as, for example, a core substrate or the like for a multilayer printed wiring board.

Board (1) with a built-in electronic element is structured with: electronic element (2); core material (3) having a penetrated portion (opening portion) in which to build electronic element (2); covering material (4) to be laminated on core material (3) so as to cover the penetrated portion of core material (3); adhesive resin (5); filling resin (6); inner-layer conductive patterns (10, 50); outer-layer conductive patterns (60, 70); and through-hole conductor 80.

Core material (3) is made of base material such as a glass cloth, alamide non-woven fabric, or glass non-woven fabric impregnated with epoxy resin, BT (bismaleimide triazine) resin or polyimide resin. Its thickness is approximately 150 µm.

Covering material (4) may be made of resin base material reinforced with glass fabric the same as core material (3), or resin base material made of inorganic filler and thermosetting resin. The amount of the inorganic filler is preferred to be in the range of 30 wt. %-90 wt. %. The thickness of covering material (4) is approximately 50 µm.

Also, core material (3) and covering material (4) may be made of base material reinforced with glass fabric. Furthermore, inorganic filler in the amount ranging from 30 to 60 wt. % may be contained.

Conductive pattern 10 is formed in the interior (hereinafter referred to as "the first inner layer") of the first-surface side (the surface opposite the surface where the circuit of electronic element (2) is formed) of board (1) with a built-in electronic element. The thickness of conductive pattern 10 is approximately 20 µm, and portions of it will become via lands 11 in the first inner layer, and through-hole lands 13 in the first inner layer connected to through-hole conductors 80. Via lands 11 in the first inner layer are electrically connected to via conductors 12, which are electrically connected to terminals 20 of electronic element (2) such as an IC chip.

Adhesive resin (5) is, for example, made of insulative resin containing inorganic filler, such as silica or alumina; it plays a role to secure the anchoring strength of electronic element (2) as well as to absorb distortion generated due to a gap in thermal expansion coefficients between electronic element (2) and the insulation material (for example, core material (3), covering material (6) and filling resin (6)). Preferably, adhesive resin (5) is made of thermosetting resin and inorganic filler in the amount of 70-90 wt. %.

Filling resin (6) is preferably made of thermosetting resin and inorganic filler. As for inorganic filler, for example, $Al_2O_3$, MgO, BN, AlN or $SiO_2$ may be used. In such a case, the amount of inorganic filler is preferred to be 30-60 wt. %. As for the thermosetting resin, for example, resins with high tolerance to heat such as epoxy resin, phenolic resin or cyanate resin are preferred. Among those, epoxy resin is especially preferred since it has excellent tolerance to heat.

Conductive pattern 50 is formed in the interior (hereinafter referred to as "the second inner layer") of the second surface of board (1) with a built-in electronic element (the main surface opposite the first surface), and has through-hole lands 51 in the second inner layer connected to through-hole conductors 80. Its thickness is approximately 20 µm. Through-hole lands 13 in the first inner layer and through-hole lands 51 in the second inner layer are electrically connected via through-hole conductors 80.

Conductive pattern 60 is formed on the first surface (hereinafter referred to as "the first outer layer") of board (1) with a built-in electronic element and includes via lands 61 in the first outer layer and through-hole lands 81 in the first outer layer connected to through-hole conductors 80. The thickness of conductive pattern 60 is approximately 20 µm. Via lands 61 in the first outer layer and via lands 11 in the first inner layer are electrically connected through via conductors 12. Via conductors 12 are filled vias where via holes are filled with copper plating or the like.

Conductive pattern 70 is formed on the second surface (hereinafter referred to as "the second outer layer") of board (1) with a built-in electronic element and includes through-hole lands 82 in the second outer layer connected to through-hole conductors 80. The thickness of conductive pattern 70 is approximately 20 µm.

Protective film 105 lies between via lands 11 in the first inner layer and via lands 61 in the first outer layer, and between through-hole lands 13 in the first inner layer and through-hole lands 81 in the first outer layer.

Also, protective film 505 lies between through-hole lands 51 in the second inner layer and through-hole lands 82 in the second outer layer.

In the following, a method for manufacturing board (1) with a built-in electronic element is described with reference to FIGS. (1A)-(4J).

(1) Steps to Form Conductive Pattern 10 (FIGS. (1A-1F))

First, support base material 100 as shown in FIG. (1A) is prepared. Support base material 100 is structured with copper foil 101 with a thickness of approximately 3 µm and carrier 102 with a thickness of approximately 75 µm. Carrier (support board) 102 is made of copper and is bonded to copper foil 101 via an adhesive layer (removable layer), which is not shown in the drawing, in such a way that it may be removed (separated) from copper foil 101.

On the surface of base material 100 (on the copper foil 101 side), photosensitive resist 103 in a dry-film state is laminated (see FIG. (1B)).

Then, on the laminated photosensitive resist 103, a mask film with a predetermined pattern is adhered, which is exposed to ultraviolet rays and developed with an alkaline solution.

As a result, plating resist layer 104 is formed where only the portions corresponding to conductive pattern 10 are open (see FIG. (1C)).

In the following, after the board shown in FIG. (1C) is washed with water and dried, electrolytic nickel plating is performed. Accordingly, protective film 105 with a thickness of approximately 3 µm is obtained (see FIG. (1D)).

Then, electrolytic copper plating is further performed to form copper-plated layer 106 with a thickness of approximately 20 µm on protective film 105 (see FIG. (1E)).

Then, plating resist layer 104 is removed, and the board is washed with water and dried. Accordingly, the board with pattern 10 is obtained as shown in FIG. (1F).

As shown in FIG. (1F), alignment mark 107 is formed at the same time as conductive pattern 10. Alignment mark 107 is a mark for aligning the position when placing (mounting) electronic element (2). Alignment mark 107 may also be used as a mark for aligning positions when forming via holes that reach each terminal 20 of electronic element (2), or forming penetrating holes for through-hole conductors 80.

Also, via lands 11 in the first inner layer are formed at the same time as conductive pattern 10.

In the above steps, conductive pattern 10 is formed through growth of plating at the portions where the plating resist pattern is not formed (a so-called additive method). Therefore, in this embodiment, the configuration of conductive pattern 10 may be retained, and thus a finer pattern may be achieved.

Additive methods include a full-additive method and a semi-additive method. Since the steps of both methods are well known (for example, see Textbook: Technologies for Printed Wiring Board, published by Nikkan Kogyo Shimbun, Ltd.), the detailed description is omitted.

(2) Steps for Mounting Electronic Element (2) (FIGS. (2A-2C))

In the following, on conductive pattern 10 of the board shown in FIG. (1F), adhesive resin (5) is applied (see FIG. (2A)). As described above, adhesive resin (5) is, for example, insulative resin containing inorganic filler such as silica or alumina. Here, the filler refers to dispersion material whose aspect ratio of the greatest length divided by the least length is in the range of (1-1.2). Adhesive resin (5) is applied on the predetermined region to cover at least via lands 11 in the first inner layer. The scope of the region for an application is preferably made larger than the area of the circuit-forming surface of electronic element (2).

After adhesive resin (5) has been applied, electronic element (2) is placed on the board shown in FIG. (2A) by a so-called face-down procedure. At that time, as shown in FIG. (2B), each terminal 20 of electronic element (2) and each via land 11 in the first inner layer are aligned. To align electronic element (2) and via lands 11 in the first inner layer, alignment mark 107 is used.

As shown in FIG. (2C), via land 11 in the first inner layer is, for example, a disc-shaped conductive pattern which has an opening portion inside. FIG. (2C) is a plan view of via land 11 in the first inner layer seen from the electronic element (2) side.

(3) Lamination Steps (FIGS. (3A, 3B))

In the following, as shown in FIG. (3A), on the board shown in FIG. (2B) (on the surface where electronic element (2) is placed), core material (3) with an opening portion, covering material (4) and board 500 with formed conductive pattern 50 are loaded and thermopressed.

By doing so, a board is obtained as shown in FIG. (3B) where core material (3), covering material (4) and board 500 are laminated on the board shown in FIG. (2B).

Here, before the thermopressing step, core material (3) and covering material (4) are base material in a semi-cured state. Therefore, during the thermopressing step, the resin ingredient contained in core material (3) and covering material (4) is drained into the opening portion of core material (3). Accordingly, the opening portion of core material (3) is filled with filling resin (6).

Board 500 is formed through the same steps as the above-described method (the steps for forming conductive pattern 10) in which the board shown in FIG. (1F) is obtained from support base material 100 shown in FIG. (1A).

Namely, first, a support base material with the same structure as support base material 100 (structured with copper foil 501 with a thickness of approximately 3 µm and carrier (support board) 502 with a thickness of approximately 75 µm) is prepared. Then, on the support base material, a photosensitive resist in a dry-film state is laminated. After that, a mask film with a predetermined pattern is adhered on the laminated photosensitive resist, which is then exposed to light and developed. Accordingly, a plating resist layer is formed where only the portions corresponding to conductive pattern 50 are open.

Then, after the board having the plating resist layer is washed with water and dried, electrolytic nickel plating and electrolytic copper plating are performed, and the plating resist layer is removed. Accordingly, board 500 where conductive pattern 50 is formed on protective film 505 is obtained.

(4) Latter-Part Steps (FIGS. (4A-4J))

In the following, from the board shown in FIG. (3B), carrier 102 and carrier 502 are removed (separated), the board shown in FIG. (4A) is obtained.

Then, from the board shown in FIG. (4A), copper foil 101 and copper foil 501 are removed by etching to obtain the board shown in FIG. (4B).

In this embodiment, as an etching solution for the above step (etchant), an alkaline etchant (an alkaline ammonia solution) is used. Such an alkaline etchant does not dissolve nickel, or at least the dissolving speed is substantially slower than that of copper. Therefore, protection films (105, 505) work as an etching resist, thus conductive patterns (10, 50) in the inner layer are protected without being influenced by the etching.

In the following, using a carbon dioxide gas ($CO_2$) laser, UV-YAG laser or the like, via holes 108 are formed in the predetermined positions of the board shown in FIG. (4B) (see FIG. (4C)). Specifically, as shown in FIG. (4C), adhesive resin (5) in the region surrounded by via lands 11 in the first inner layer is removed by the above laser or the like until a hole reaches its corresponding terminal 20.

After forming via holes 108, by a known drilling method using a mechanical drill or the like, through-holes 109 are bored in the board shown in FIG. (4C) (see FIG. (4D)).

In the following, a treatment (desmear treatment) is conducted to remove the smear or the like remaining at the bottom of via holes 108 and inner walls of through-holes 109. The desmear treatment is conducted using a permanganate method. Specifically, first, after a conditioning (swelling resin) treatment is conducted on the board shown in FIG. (4D), the board is immersed in a desmearing solution containing permanganate in the amount of 40-80 g/l at a temperature of 50-80° C. for about 5-20 minutes. Then, the board is washed with water, immersed in a neutralizing solution, washed with water and dried. As a result, the smear is removed from the board shown in FIG. (4D) and clean surfaces are exposed.

After the desmearing treatment, by immersing the board shown in FIG. (4D) in a catalytic solution containing a tin-palladium complex salt (or a colloid), a catalyst for starting electroless copper plating is adhered to both main surfaces of the board, the inner surfaces of via holes 108 and the inner surfaces of through-holes.

Then, the board with the adhered catalyst is immersed in an electroless copper plating solution, and an electroless copper-plated film is formed on both main surfaces of the board. In the following, the formed electroless copper-plated film is used as a seed layer, on which an electrolytic copper-plated film is formed. Accordingly, copper-plated films 115 structured with an electroless copper-plated film and an electrolytic copper-plated film are formed. Here, at the same time, copper-plated films 115 are formed inside via holes 108 and on the surfaces of through-holes 109. Accordingly, via conductors 12 and through-hole conductors 80 are formed (see FIG. (4E)).

Next, inside through-hole conductors 80, through-hole filling material 83 made of inorganic filler and thermosetting resin is filled, dried and cured (see FIG. (4F)). As for the filling method in this case, a known method such as screen printing may be employed.

After filling through-hole filling material 83, on each main surface of the board shown in FIG. (4F), a photosetting resist in a dry-film state is laminated. Then on each photosetting resist, a mask film each having a predetermined pattern is adhered, exposed to ultraviolet rays and developed using an alkaline solution.

As a result, plating resist layers (116, 506) are formed in which only the portions corresponding to conductive patterns (60, 70) are open (see FIG. (4G)).

In the following, after the board shown in FIG. (4G) is washed with water and dried, electroless copper plating and electrolytic copper plating are performed. By doing so, copper-plated layers (117) with a thickness of approximately 20 μm are formed at the opening portions in plating resist layers (116, 506) (see FIG. (4H)).

Then, plating resist layers (116, 506) are removed, washed with water and dried. Accordingly, the board shown in FIG. (4I) is obtained.

Then, by etching away copper-plated films 115 on both main surfaces of the board shown in FIG. (4I), conductive patterns (60, 70) are formed (see FIG. (4J)). Also, at the same time, through-hole covering films 118 are formed that cover through-hole filling material 83.

The conductive patterns are formed by a so-called semi-additive method. As the etching solution for this process, the same as above, an alkaline etchant is used. In doing so, protective films (105, 505) work as an etching resist, thus conductive patterns (10, 50) in the inner layers are protected without being influenced by the etching.

Next, by selectively etching exposed protective films (105, 505), board (1) with a built-in electronic element shown in FIG. (5) is obtained. As for the etching solution for this process, an etching solution is used by which nickel is dissolved but copper is not dissolved; or an etching solution is used in which a ratio obtained by dividing the dissolving speed of nickel by that of copper is large. For example, an etching solution such as a mixed solution of hydrogen peroxide, nitric acid, phosphoric acid or the like is used. Through this process, conductive pattern (10a) in the first inner layer (portions excluding via lands 11 in the first inner layer and through-hole lands 13 in the first inner layer from conductive pattern 10 in the first inner layer) and conductive pattern (50a) in the second inner layer (portions excluding through-hole lands 51 in the second inner layer from conductive pattern 50 in the second inner layer) are configured concave with regard to the surfaces of the core substrate.

When the conductive pattern in the inner layer formed on the first-surface side of the board with a built-in electronic element includes an alignment mark, conductive pattern (10a) in the first inner layer does not include an alignment mark. In the same manner, when the conductive pattern in the inner layer formed on the second-surface side of the board with a built-in electronic element includes an alignment mark, conductive pattern (50a) in the second inner layer does not include an alignment mark.

Board (1) with a built-in electronic element manufactured as described above has excellent characteristics as follows.

(1) Since conductive pattern 10 electrically connected to terminals 20 of electronic element (2) is formed by an additive method, it is easier to make a finer pattern for conductive pattern 10. By doing so, conductive pattern (10a) in the first inner layer and via lands 11 in the first inner layer are made fine, thus making it easier to build in an electronic element with narrow-pitch terminals. Also, by making finer conductive pattern (10a) in the first inner layer, the diameter of the via lands in the inner layer may be set large. Accordingly, aligning the electronic element and the via lands in the inner layer may be made easier. Furthermore, the connection reliability between the terminals of the electronic element and the via lands in the inner layer may be enhanced.

(2) Also, since protective film 105 works as an etching resist during the manufacturing process to protect conductive pattern 10, the pattern configuration of conductive pattern 10 may not be easily damaged. Therefore, its fine pattern may be maintained. Also, the configurations of via lands 11 in the first inner layer and those of via conductors 12 connected to them are protected by protective film 105, thus the connection reliability with electronic element (2) may be secured.

Embodiment (2)

In the following, a method for manufacturing a board with a built-in electronic element according to Embodiment (2) is described with reference to FIGS. (6A)-(6J). Regarding the parts common to Embodiment (1), the same numerical references are assigned and their descriptions are omitted.

In Embodiment (1), in the step shown in FIG. (3A), the following were laminated: the board shown in FIG. (2B) with loaded electronic element (2); core material (3) (a B-stage base material); covering material (4) (a B-stage base material); and board 500 with conductive pattern 50.

Instead, in Embodiment (2), as shown in FIG. (6A), the following were laminated: the board (board shown in FIG. (2B)) with loaded electronic element (2); core material (3); and covering material 600 (a B-stage single-sided copper-clad laminate structured with copper foil 601 and insulative material 602; insulative material 602 is the same material as covering material (4)).

Next, as shown in FIG. (6B), each base material laminated in FIG. (6A) was integrated by adding heat and pressure. During this step, the same as in Embodiment (1), from core material (3) and insulative material 602 of covering material 600, thermosetting resin or thermosetting resin along with inorganic filler flows into the through-hole portion (opening portion) in core material (3). Accordingly, the opening portion in core material (3) is filled with filling resin (6).

Next, as shown in FIG. (6C), carrier (support board) 102 was removed.

Then, from the board shown in FIG. (6C), only copper foil 101 on the first-surface side was etched away (see FIG. (6D)). The etching solution used here is the same etching solution used in the step with reference to FIG. (4B) in Embodiment (1). Copper foil 601 on the second-surface side was protected with a resist.

Next, as shown in FIG. (6E), via holes 108, and through-holes 603 where through-hole lands 13 are in the first inner layer were formed using alignment mark 107.

Then, as shown in FIG. (6F), electroless copper plating and electrolytic copper plating were performed on the entire board, and via conductors 12 and through-hole conductors 604 were formed.

Next, as shown in FIG. (6G), inside through-hole conductors 604, through-hole filling material 605 made of inorganic filler and thermosetting resin was filled.

Then, on both main surfaces of the board shown in FIG. (6G), an electroless copper-plated film and an electrolytic copper-plated film were formed (see FIG. (6H)).

Next, as shown in FIG. (6I), by removing the copper-plated film from unnecessary portions, conductive pattern 606 was formed. In this embodiment, conductive pattern 606 was formed by a subtractive method. The same as in Embodiment (1), the conductive pattern may also be formed by a semi-additive method.

At the same time when forming conductive pattern 606, through-hole covering film 607 was formed on through-hole filling material 605.

Then, by removing protective film 105 on the first-surface side, the board with a built-in electronic element shown in FIG. (6J) was obtained.

On the second-surface side of the board with a built-in element in Embodiment (2), a conductive pattern is not formed inside insulative material 602 (namely, insulative resin for building in an electronic element). As such, if a conductive pattern is not embedded in the insulative resin for building in an electronic element, on the second surface of the board with a built-in electronic element, it is easier to form a conductive pattern directly on the portion over the built-in electronic element. That is because the insulation gap between the electronic element and the conductive pattern is set sufficiently large.

Embodiment (3)

In the following, a method for manufacturing a board with a built-in electronic element according to Embodiment (3) is described with reference to FIGS. (7A-7P). Regarding the parts common to Embodiments (1, 2), the same numerical references are assigned and their descriptions are omitted.

First, support base material 100 structured with copper foil 101 and carrier 102 was prepared. Then, as shown in FIG. (7A), on the surface of base material 100 (on the copper foil 101 side), nickel layer 701 with a thickness of approximately 3 μm was formed. Here, nickel layer 701 was formed on the entire surface of copper foil 101.

In the following, on the surface (on the copper foil 101 side) of base material 100, a plating resist was formed, and using a photographic method, the plating resist was patterned (formation of plating resist layer 104) (see FIG. (7B)).

Then, as shown in FIG. (7C), in the portions where plating resist layer 104 was not formed, an electrolytic copper-plated film (copper-plated layer 106) was formed.

Next, as shown in FIG. (7D), plating resist layer 104 was removed.

Next, using the same step as in Embodiment (1) (see FIGS. (2A, 2B)), electronic element (2) was mounted (see FIGS. (7E, 7F)).

Then, using the same steps as in Embodiment (2) (see FIGS. (6A, 6B), on the board with loaded electronic element (2), core material (3) and covering material 600 were laminated (see FIGS. (7G, 7H)).

Next, as shown in FIG. (7I), carrier (support board) 102 was removed.

Next, using the same etching solution as in Embodiments (1, 2), copper foil 101 was selectively etched away, and then unnecessary portions of nickel layer 701 were selectively etched away. By doing so, protective film 702 was formed (see FIG. (7J)). As for the etching solution used for this step, "NP-1865" made by Mec Co. Ltd. was used.

Next, in the board shown in FIG. (7J), through-holes 703 were formed. Also, the same as in Embodiments (1, 2), using protective film 702 as a conformal mask, via holes 704 that reach terminals 20 of electronic element (2) were formed (see FIG. (7K)).

The following steps (FIGS. (7L-7P)) were the same as in Embodiment (2) (FIGS. (6F-6J)).

In the board with a built-in electronic element shown in FIG. (7P), conductive patterns on both main surfaces may be formed using a semi-additive method.

Figure 8:
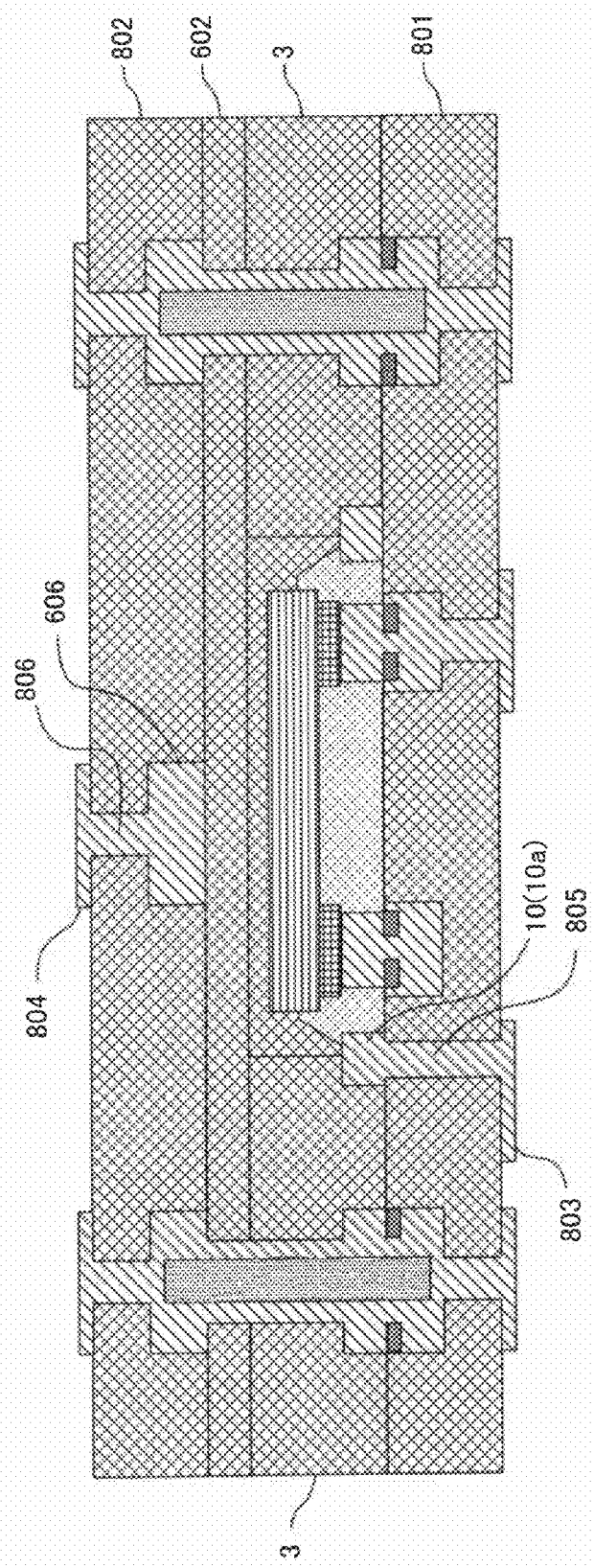

FIG. (8) shows an example of a built-up multilayer printed wiring board using the board with a built-in electronic element shown in FIG. (7P) as a core substrate. The steps for manufacturing the built-up multilayer printed wiring board shown in FIG. 8 are briefly described.

First, on the first and second surfaces of the core substrate (namely, the board with a built-in electronic element shown in FIG. (7P)), interlayer resin insulation layers (801, 802) are formed respectively. After that, opening portions that reach conductive patterns (10, 606) formed in the core substrate are formed in interlayer resin insulation layers (801, 802). Here, opening portions that reach the through-hole covering film or via conductors may also be formed. In the following, on interlayer resin insulation layers (801, 802), conductive patterns (803, 804) are formed respectively. At the same time during the process, in the opening portions in interlayer resin insulation layers (801, 802), via conductors (805, 806) are formed respectively. By doing so, conductive pattern 10 and conductive pattern 803 are made connected, and conductive pattern 606 and conductive pattern 804 are made connected.

Here, taking the core substrate of Embodiment (3) as an example, a method or the like for manufacturing a built-up multilayer printed wiring board was described. However, using the same method, by forming built-up layers on the core substrate of Embodiment (1) (see FIG. (5)) or on the core substrate of Embodiment (2) (see FIG. (6J)), a built-up multilayer printed wiring board may be manufactured.

In Embodiments (1, 2), the surface of conductive pattern (10a) in the first-surface side of the core substrate is made concave with regard to the first surface of the core substrate. In contrast, in Embodiment (3), the surface of conductive pattern (10a) in the first-surface side of the core substrate is positioned substantially flush with the first surface of the core substrate. Accordingly, when manufacturing a built-up multilayer printed wiring board, rather than using the core substrates in Embodiments (1, 2), by using the core substrate in Embodiment (3), the depth of the openings to form via conductors may be made shallow. As a result, it is found that the connection reliability between the conductive pattern in the core substrate and the conductive pattern on the interlayer resin insulation layer may be more easily enhanced.

In each of the above embodiments, a method for manufacturing a board with a built-in electronic element according to the present invention was described. However, the present invention is not limited to each of the above embodiments but varieties of modifications may be made within a scope that does not deviate from the abstract of the present invention.

For example, as for protective films (105, 702), other than nickel, titanium or tin may also be employed.

A method for manufacturing a board with built-in electronic elements according to an embodiment of the present invention has: on a support base material structured with a support board and a metal foil, a step to form a protective film made of metal on at least part of the metal foil; on the protective film, a step to form a conductive pattern made of metal using an additive method; on the board with the formed conductive pattern, a step to place an electronic element in such a way that the surface where a circuit of the electronic element is formed faces the surface where the conductive pattern is formed; a step to cover the electronic element with an insulative resin; a step to etch away the metal foil by using a first etching solution; and a step to electrically connect terminals of the electronic element and part of the conductive pattern. The protective film is not dissolved by the first etching solution or its etching speed is slow compared with that of the metal foil.

It is preferred that the metal foil and the conductive pattern be made of copper and that the protective film be made of one or more kind of metal from among nickel, titanium and tin.

It is preferred that the etching solution in the above case be an alkaline etchant.

It is preferred that a step be further conducted in which an adhesive resin is formed on the surface where the conductive pattern is formed before the placement of the electronic element, and that the electronic element and the board be bonded via the adhesive resin.

It is preferred that inorganic filler in the above case be contained in the adhesive resin.

It is preferred that the scope of the region to form adhesive resin be made larger than the area of the surface where the circuit of the electronic element is formed.

In the conductive pattern, a mark for aligning the position when placing the electronic element may be included.

The protective film may be formed so as to match the pattern configuration of the conductive pattern.

Alternatively, the protective film may be formed on the entire surface of the metal foil.

In the above case, it is preferred that a step be further conducted to etch away unnecessary portions of the protective film using a second etching solution; and that the conductive pattern be made so as not to be dissolved by the second etching solution or its etching speed be slow compared with that of the protective film.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for manufacturing a board with a built-in electronic element, comprising:
   providing a support substrate comprising a support base and a metal foil;
   forming a protective film comprising a metal material on the metal foil of the support substrate;
   forming a conductive pattern comprising a metal material on the protective film by an additive method, said forming a conductive pattern comprising forming at least one of a through-hole land and a via land;
   forming at least one of a via hole and a through-hole through said protective film;
   forming at least one of a through-hole conductor and a via conductor simultaneously with said forming a conductive pattern
   placing an electronic element on the support substrate with the conductive pattern such that a surface of the electronic element where a circuit is formed faces the conductive pattern;
   covering the electronic element with an insulative resin;
   etching away the metal foil using a first etching solution such that the protective film is not dissolved by the first etching solution or that the protective film has an etching speed which is slower than an etching speed of the metal foil; and
   electrically connecting terminals of the electronic element and a part of the conductive pattern.

2. The method for manufacturing a board with a built-in electronic element according to claim 1, wherein the metal materials of the metal foil and conductive pattern comprise copper, and the protective film comprises at least one metal selected from the group consisting of nickel, titanium and tin.

3. The method for manufacturing a board with a built-in electronic element according to claim 2, wherein the etching solution is an alkaline etchant.

4. The method for manufacturing a board with a built-in electronic element according to claim 1, further comprising forming an adhesive resin on a surface where the conductive pattern is formed before placing the electronic element, wherein the electronic element and the support substrate are bonded via the adhesive resin.

5. The method for manufacturing a board with a built-in electronic element according to claim 4, wherein the adhesive resin includes inorganic filler.

6. The method for manufacturing a board with a built-in electronic element according to claim 4, wherein a region to form the adhesive resin is made larger than an area of a surface where the circuit is formed on the electronic element.

7. The method for manufacturing a board with a built-in electronic element according to claim 1, wherein the conductive pattern includes a mark formed to align a position for placing the electronic element on the support substrate.

8. The method for manufacturing a board with a built-in electronic element according to claim 1, wherein the protective film is formed so as to match a pattern configuration of the conductive pattern.

9. The method for manufacturing a board with a built-in electronic element according to claim 1, wherein the protective film is formed on an entire surface of the metal foil.

10. The method for manufacturing a board with a built-in electronic element according to claim 9, further comprising etching away unnecessary portions of the protective film using a second etching solution such that the conductive pattern is not dissolved by the second etching solution or that the conductive pattern has an etching speed which is slower than an etching speed of the protective film.

* * * * *